United States Patent
Sekerli et al.

(10) Patent No.: US 11,656,642 B2
(45) Date of Patent: May 23, 2023

(54) SLEW RATE IMPROVEMENT IN MULTISTAGE DIFFERENTIAL AMPLIFIERS FOR FAST TRANSIENT RESPONSE LINEAR REGULATOR APPLICATIONS

(71) Applicant: Analog Devices, Inc., Wilmington, MA (US)

(72) Inventors: Murat Sekerli, San Jose, CA (US); Matthew Winslow Oesting, San Jose, CA (US)

(73) Assignee: Analog Devices, Inc., Wilmington, MA (US)

( * ) Notice: Subject to any disclaimer, the term of this patent is extended or adjusted under 35 U.S.C. 154(b) by 160 days.

(21) Appl. No.: 17/168,735

(22) Filed: Feb. 5, 2021

(65) Prior Publication Data

US 2022/0253082 A1    Aug. 11, 2022

(51) Int. Cl.
*H03F 3/45*    (2006.01)
*G05F 1/575*   (2006.01)

(52) U.S. Cl.
CPC ......... *G05F 1/575* (2013.01); *H03F 3/45475* (2013.01); *H03F 2200/129* (2013.01); *H03F 2203/45116* (2013.01)

(58) Field of Classification Search
CPC ......... G05F 1/575; G05F 1/569; G05F 1/571; G05F 1/573; G05F 1/5735; G05F 1/59; H03F 3/45475; H03F 3/45479; H03F 3/45484; H03F 3/45493; H03F 3/45497; H03F 3/45529
See application file for complete search history.

(56) References Cited

U.S. PATENT DOCUMENTS

| | | |
|---|---|---|
| 5,041,793 A | 8/1991 | Gailus |
| 5,343,164 A | 8/1994 | Holmdahl |
| 6,157,176 A | 12/2000 | Pulvirenti et al. |
| 6,201,375 B1 | 3/2001 | Larson et al. |
| 6,359,512 B1 | 3/2002 | Ivanov et al. |
| 6,388,433 B2 | 5/2002 | Marty |
| 6,771,126 B2 | 8/2004 | Blankenship et al. |
| 6,903,588 B2 | 6/2005 | Vorenkamp |
| 7,348,851 B2 | 3/2008 | Chen et al. |
| 7,362,173 B1 | 4/2008 | Knausz |
| 7,385,379 B2 | 6/2008 | Aioanei |
| 7,402,987 B2 | 7/2008 | Lopata |
| 7,498,780 B2 | 3/2009 | Chen et al. |

(Continued)

FOREIGN PATENT DOCUMENTS

| | | |
|---|---|---|
| CN | 102385410 B | 9/2013 |
| KR | 101410696 B1 | 6/2014 |

*Primary Examiner* — Nguyen Tran
(74) *Attorney, Agent, or Firm* — Schwegman Lundberg & Woessner, P.A.

(57) ABSTRACT

An electronic circuit comprises an error amplifier and an overshoot and undershoot detection circuit. The error amplifier has an output stage including a differential input to single ended output amplifier that includes a frequency compensation resistor. A switch circuit is connected across the frequency compensation resistor that shunts the frequency compensation resistor when activated. The overshoot and undershoot detection circuit compares differential input nodes of the output amplifier to a baseline voltage signal and activates the switch circuit when detecting an overshoot condition or an undershoot condition using the baseline voltage signal.

22 Claims, 19 Drawing Sheets

(56) References Cited

U.S. PATENT DOCUMENTS

| | | |
|---|---|---|
| 7,652,538 B2 | 1/2010 | Choi |
| 7,714,553 B2 | 5/2010 | Lou |
| 7,808,268 B2 | 10/2010 | Bucossi et al. |
| 7,924,056 B2 | 4/2011 | Kumar et al. |
| 8,089,314 B2 | 1/2012 | Thakker et al. |
| 8,217,721 B1 | 7/2012 | Hsieh |
| 8,294,441 B2 | 10/2012 | Gurcan et al. |
| 8,305,066 B2 | 11/2012 | Lin et al. |
| 8,344,713 B2 | 1/2013 | Shrivas et al. |
| 8,390,379 B2 | 3/2013 | Snoeij et al. |
| 8,432,226 B1 | 4/2013 | Joffe |
| 8,436,595 B2 | 5/2013 | Simmons et al. |
| 9,054,657 B2 | 6/2015 | Kumar et al. |
| 9,543,912 B2 | 1/2017 | Lee |
| 9,634,617 B2 | 4/2017 | Ivanov et al. |
| 10,536,117 B1 | 1/2020 | Far |
| 2002/0109547 A1 | 8/2002 | Ivanov et al. |
| 2004/0051585 A1 | 3/2004 | Johnson |
| 2005/0118980 A1* | 6/2005 | Pai .................... H03H 11/1291 455/340 |
| 2005/0206451 A1 | 9/2005 | Ricotti |
| 2005/0242873 A1* | 11/2005 | Chen ................ H03H 11/1291 327/553 |
| 2007/0008009 A1 | 1/2007 | Son et al. |
| 2007/0008036 A1 | 1/2007 | Chen et al. |
| 2008/0001662 A1 | 1/2008 | Dalena |
| 2008/0122478 A1 | 5/2008 | Mei |
| 2010/0052735 A1 | 3/2010 | Burkland et al. |
| 2010/0117736 A1* | 5/2010 | Liao ................... H03F 3/45475 330/86 |
| 2010/0164625 A1 | 7/2010 | Wong et al. |
| 2010/0231301 A1 | 9/2010 | Bruin |
| 2011/0156671 A1 | 6/2011 | Gakhar et al. |
| 2012/0280667 A1 | 11/2012 | Drebinger et al. |
| 2013/0113447 A1 | 5/2013 | Kadanka |
| 2014/0159683 A1 | 6/2014 | Pan et al. |
| 2014/0375384 A1 | 12/2014 | Bohannon et al. |
| 2015/0200634 A1 | 7/2015 | Maige et al. |
| 2018/0026618 A1 | 1/2018 | Nicollini et al. |

* cited by examiner

SLEW RATE IMPROVEMENT IN MULTISTAGE DIFFERENTIAL AMPLIFIERS FOR FAST TRANSIENT RESPONSE LINEAR REGULATOR APPLICATIONS

FIELD OF THE DISCLOSURE

This document relates to integrated circuits and in particular to linear regulator circuits.

BACKGROUND

Regulator circuits are used to provide a regulated voltage to circuits that are sensitive to variations in circuit voltage. A low dropout (LDO) regulator circuit is one type of regulator circuit. LDO regulators find application in low noise power supplies and in post regulating switching regulator outputs for a ripple free output. An LDO regulator essentially provides a constant voltage at its output to supply power to voltage sensitive circuitry regardless of changes to its input supply voltage or the load current. The ever-growing electronics field and the new technologies necessitate tighter voltage output power supplies not only in steady state operation but also in transient load requirements.

SUMMARY OF THE DISCLOSURE

This document relates generally to regulator circuits and more specifically to circuit amplifiers that include compensation to improve response to overshoot and undershoot conditions. In some aspects, an electronic circuit comprises an error amplifier having an output stage including a differential input to single ended output amplifier that includes a frequency compensation resistor; a switch circuit connected across the frequency compensation resistor, wherein activating the first switch circuit shunts the frequency compensation resistor; and an overshoot and undershoot detection circuit configured to compare differential input nodes of the output amplifier to a baseline voltage signal and activate the first switch circuit when detecting an overshoot condition or an undershoot condition using the baseline voltage signal.

In some aspects, a method of overshoot and undershoot compensation for an amplifier comprises comparing differential input nodes of the amplifier to a baseline voltage signal; and shunting a frequency compensation resistor of the output stage when detecting an overshoot condition or an undershoot condition according to the comparing to the baseline voltage signal.

In some aspects, an electronic circuit comprises an operational amplifier (opamp) and an undershoot and overshoot detection circuit. The opamp includes a differential input and a single ended output, a frequency compensation resistor, and a first switch transistor coupled across the frequency compensation resistor to shunt the frequency compensation resistor when activated. The undershoot and overshoot detection circuit compares differential input nodes of the opamp to a baseline voltage signal and activates the first transistor circuit when detecting an overshoot condition or an undershoot condition using the baseline voltage signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
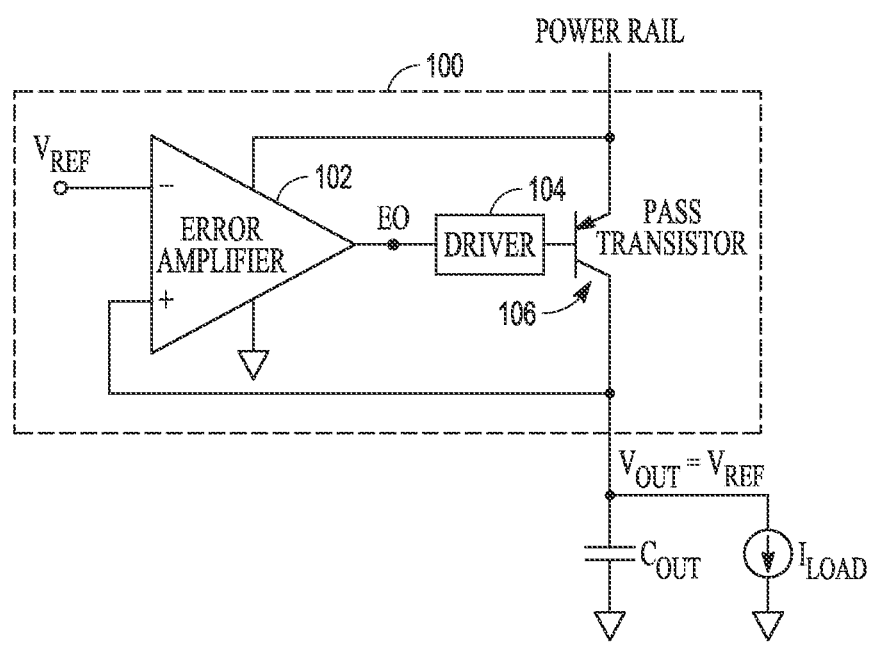
FIG. 1 is a circuit schematic of an example of a linear regulator circuit.

FIG. 1 is a circuit schematic of an example of a linear regulator circuit 100 that includes an error amplifier 102, a driver circuit 104, a pass transistor 106, and an output capacitor ($C_{OUT}$). The circuit load that is external to the linear regulator circuit 100 is represented as load current sink $I_{LOAD}$. The error amplifier 102 compares the output voltage ($V_{OUT}$) to a reference voltage ($V_{REF}$) and generates an error signal (EO) at the output of the error amplifier 102 that is provided to the driver circuit 104. The driver circuit 104 sets the control voltage of the pass transistor 106 based on the error signal. The control voltage of the pass transistor 106 adjusts the current provided by the pass transistor 106 to satisfy the external load. The error amplifier 102 provides negative feedback to make sure that $V_{OUT}$ equals $V_{REF}$ for all values of load current provided to the external load.

Figure 2:
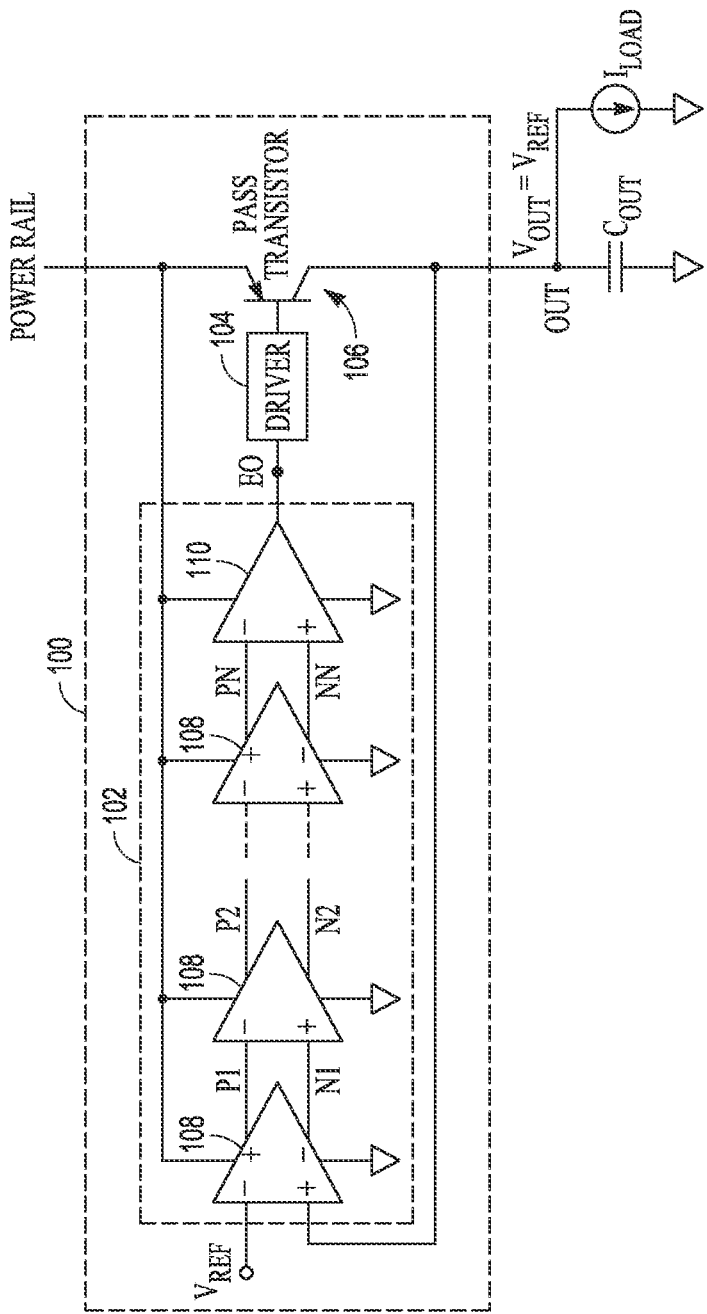
FIG. 2 is a circuit schematic of another example of a linear regulator circuit.

FIG. 2 is a circuit schematic of the linear regulator circuit 100 in FIG. 1 with the error amplifier 102 implemented as a cascade of N differential amplifiers 108 (where N is an integer greater than 1) and one differential input to single ended output amplifier 110. The linear regulator circuit 100 can respond to changes in load current if the speed of the change is within the bandwidth of the regulator. However, for rapid changes in load current that are outside the bandwidth, the linear regulator 100 cannot respond fast enough.

Figure 3:
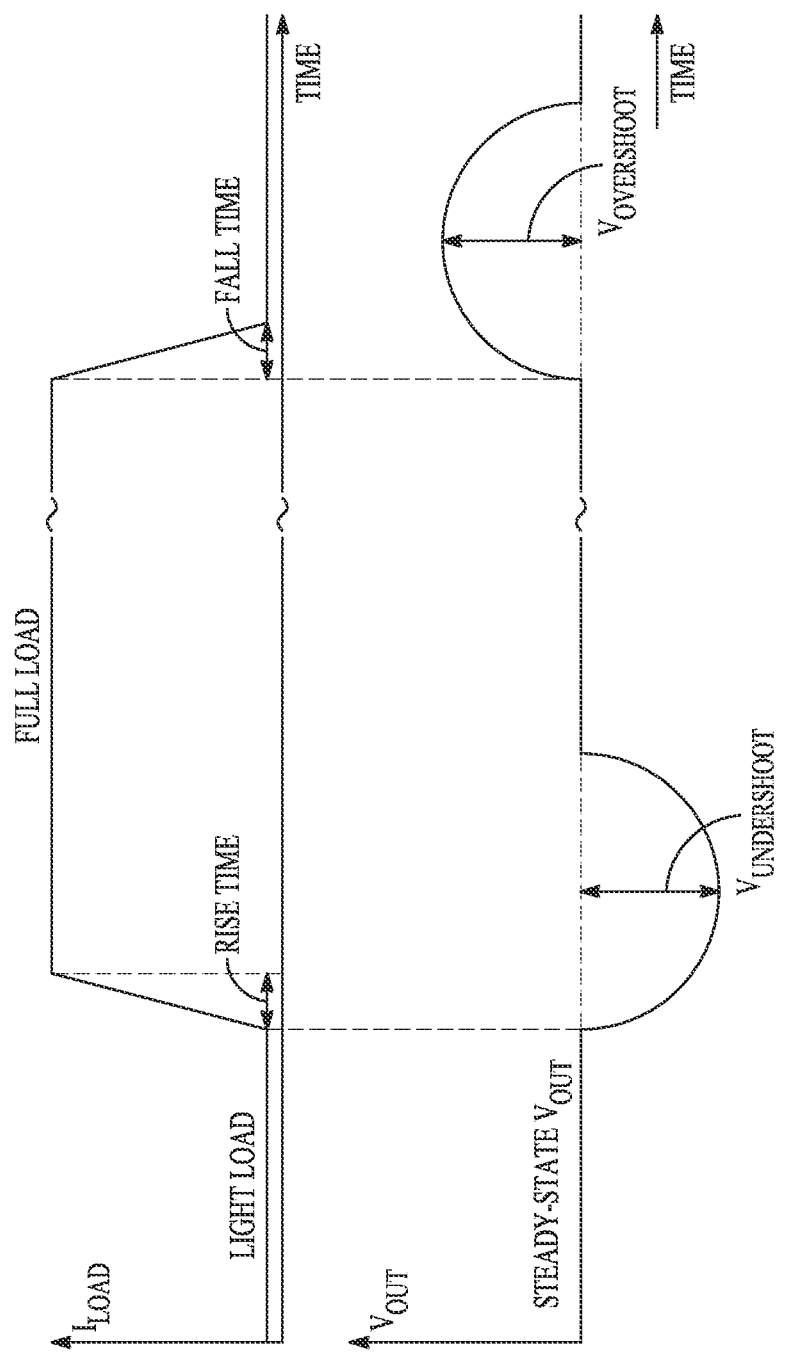
FIG. 3 are representative waveforms of load current and output voltage for the linear regulator circuit of the example of FIG. 1.

FIG. 3 are representative waveforms of load current ($I_{LOAD}$) and output voltage ($V_{OUT}$) for the linear regulator circuit of FIG. 1 when there are rapid changes in load current. When the load current increases rapidly from light load to full load, the output capacitor $C_{OUT}$ provides the extra current to the load until the linear regulator circuit 100 can respond and increase the current through the pass transistor 106. For the rapid increase, $C_{OUT}$ loses charge and the output voltage $V_{OUT}$ drops momentarily before recovering. This is an undershoot event because the output voltage drops below the steady state target regulated output voltage. In the graph, the output voltage drops by an amount $V_{UNDERSHOOT}$ from the steady state value.

When the load current decreases rapidly from full load back to light load, the linear regulator circuit 100 does not respond immediately to decrease the current through the pass transistor 106. The difference between the unadjusted pass transistor current and the light load current flows to $C_{OUT}$ to charge $C_{OUT}$ and the output voltage increases momentarily. This is an overshoot event because the output voltage increases above the steady state target regulated output voltage. In the graph, the output voltage increases by an amount $V_{OVERSHOOT}$ above the steady state target regulated output voltage.

Increasing the capacitance of $C_{OUT}$ would improve $V_{UNDERSHOOT}$, $V_{OVERSHOOT}$, and the settling time of the linear regulator circuit 100, but increasing $C_{OUT}$ is not desirable as higher capacitance usually requires larger case sizes along with increased cost. Therefore, an improved method is needed to minimize the voltage excursions and the settling time of regulator output in response to rapid changes in load without sacrificing size.

The main reason the linear regulator circuit 100 cannot respond quickly enough to prevent undershoot and overshoot is because of the slew rate of the error amplifier 102. Adding a frequency compensation capacitor in the error amplifier provides stable operation of the regulator, but the charging and discharging of this capacitor slows the response time of the regulator.

Figure 4:
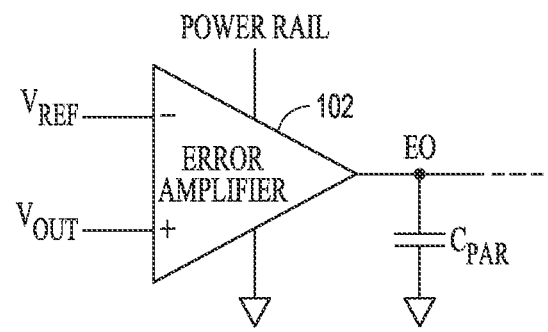
FIG. 4 is a circuit schematic showing an example of an error amplifier of a regulator circuit.
Figure 5:
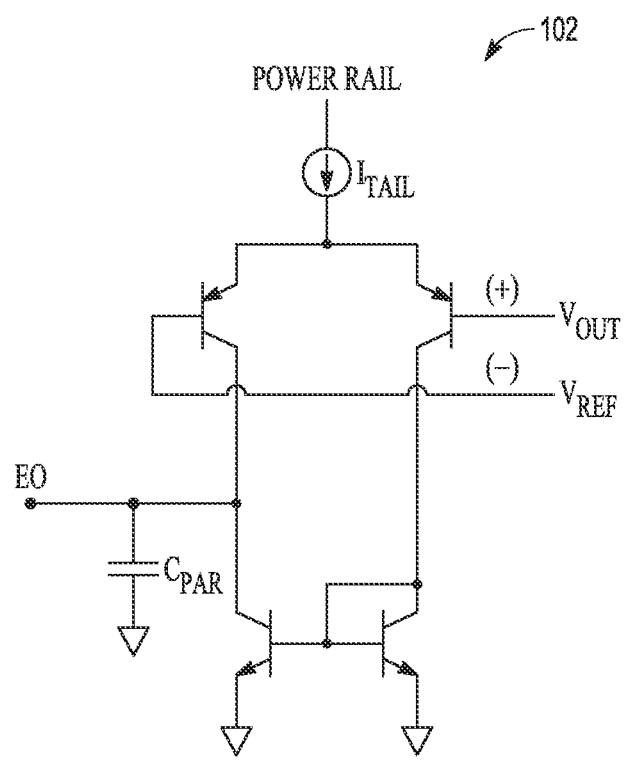
FIG. 5 is a transistor-level circuit schematic of the circuit of the example of FIG. 4.

FIG. 4 is a circuit schematic showing a method of using a parallel compensation capacitor ($C_{PAR}$) from the output of the error amplifier (EO) to circuit ground as a frequency compensation capacitor. FIG. 5 is the circuit of FIG. 4 with the error amplifier 102 shown in more detail. One way of reducing the undershoot/overshoot events is to increase the charging and discharging current of the frequency compensation capacitor by increasing the tail current $I_{TAIL}$ of the error amplifier 102.

The tail current can be increased all the time or only during the transient undershoot and overshoot events. Increasing the tail current all the time is not efficient. Sensing the transient undershoot and overshoot events and increasing the tail current only during the transient events increases the slew rate of the error amplifier 102 if the parallel compensation capacitor ($C_{PAR}$) is used as in FIG. 4, but increasing the tail current does not work efficiently if the frequency compensation is Miller compensation as is explained later herein. Therefore, an improved method is needed to reduce the transient overshoot and undershoot events when the error amplifier 102 is a Miller compensated amplifier.

Figure 6:
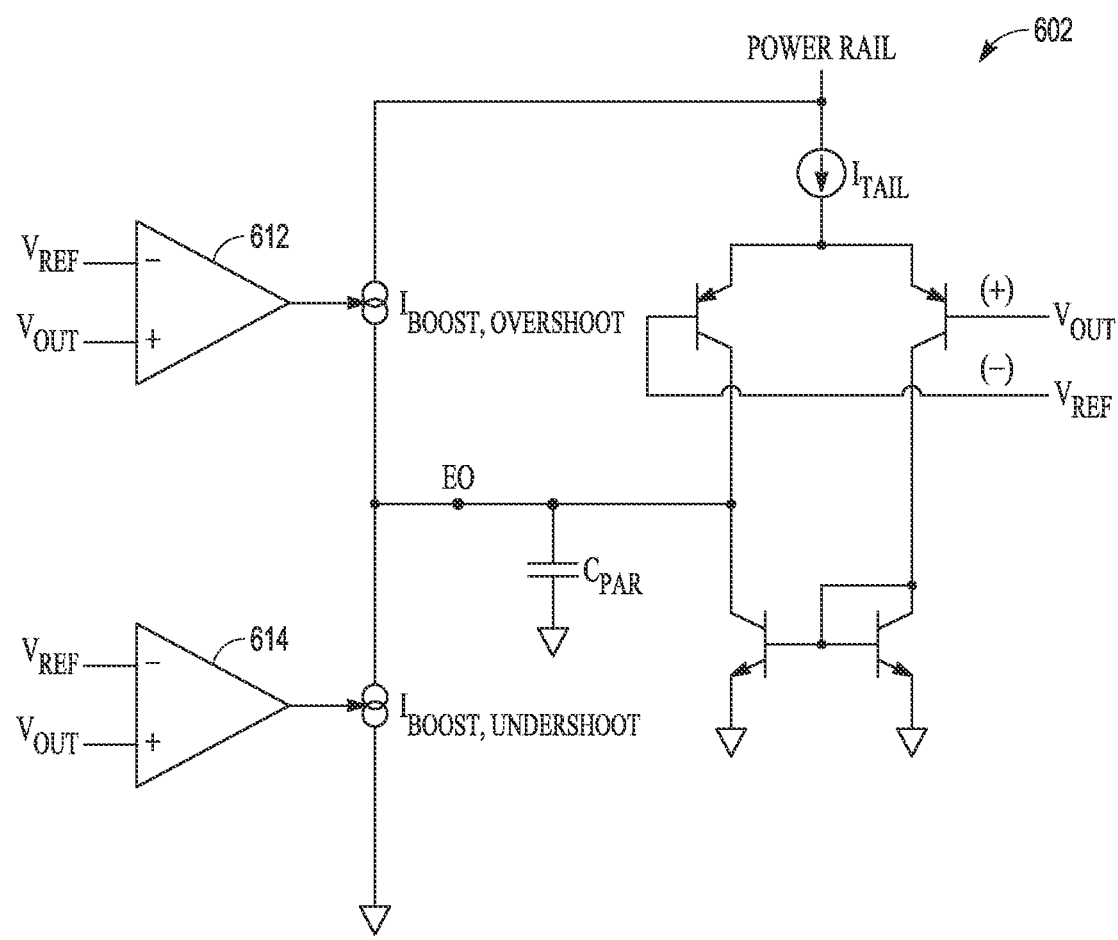
FIG. 6 is a circuit schematic of another example of an error amplifier of a regulator circuit.

Another way of reducing the undershoot and overshoot events is to increase the charging and discharging current of the frequency compensation capacitor. FIG. 6 is a circuit schematic of an example of an error amplifier 602 that includes a current source for transient overshoot events ($I_{BOOST,OVERSHOOT}$) and a current source for transient undershoot events ($I_{BOOST,UNDERSHOOT}$). An overshoot comparator 612 is used to detect an overshoot event and apply the overshoot boost current source to increase the slew rate, and an undershoot comparator 614 is used to detect an undershoot event and apply the undershoot boost current source to increase the slew rate. Using two comparators and applying opposing current signals may cause signal chattering and instability in the output voltage after an undershoot or overshoot event, which is very undesirable in an actual implementation. Therefore, there is a need for speeding up the response of a linear regulator circuit during the transient events without causing chattering in the regulated output voltage.

Figure 7:
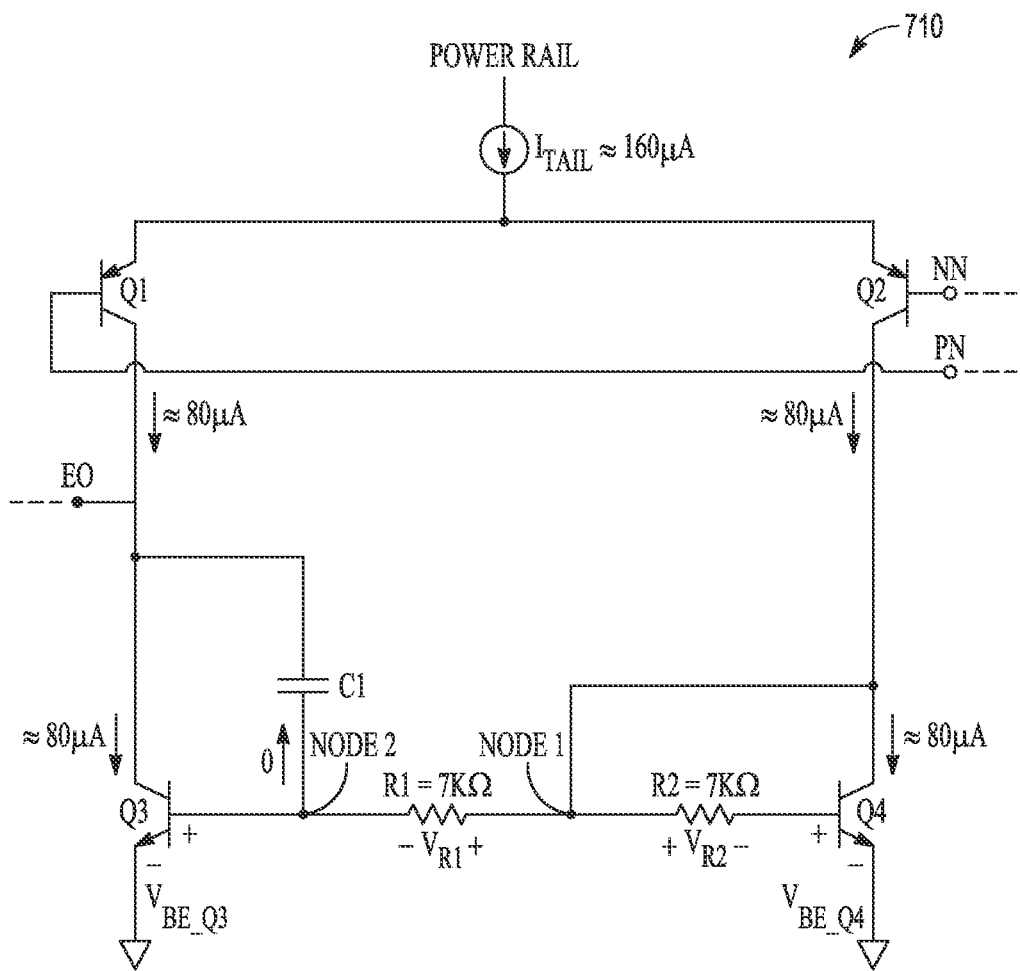
FIG. 7 is a circuit schematic of an example of a differential input to single ended output amplifier.

FIG. 7 is a circuit schematic of an example of a differential input to single ended output amplifier 710. The amplifier 710 may be an operational amplifier (opamp), or may be included in an error amplifier, such as the output amplifier 110 in the linear regulator circuit 100 of FIG. 2 for example with inputs NN and PN coming from the previous stage differential amplifier. The amplifier 710 includes frequency compensation capacitor C1 and resistor R1.

During steady state operation, there is voltage balance at the inputs, which are the base terminals of transistors Q1 and Q2. Because the base-to-emitter voltages ($V_{BE}$) of Q1 and Q2 are identical, the collector currents of Q1 and Q2 are also identical, and (ignoring the base currents of Q1 and Q2) half of the tail current $I_{TAIL}$ flows through transistors Q2 to Q4, and the other half of the tail current ($I_{TAIL}/2$) flows through Q1 to Q3. If the tail current is 160 microamps (160 μA), 80 μA flows through transistors Q2 to Q4 and 80 μA flows through transistors Q1 to Q3. The voltage drop across R1 is opposite in direction to the voltage drop across R2, but the voltage drops are equal in value satisfying Kirchoff's Voltage Law from the collector of Q4 to ground. That is:

$$V_{BE\_Q3}+V_{R1}=V_{BE\_Q4}+V_{R2}.$$

Figure 8:
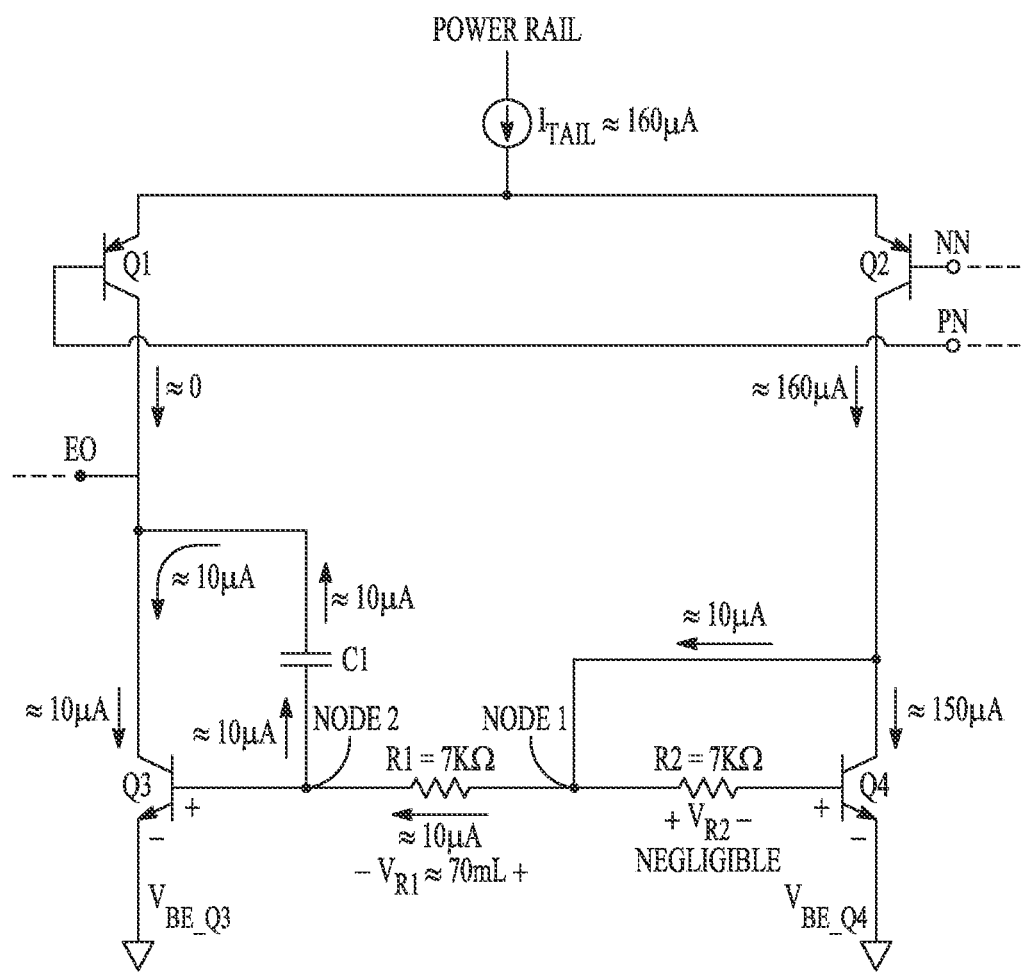
FIG. 8 is the circuit schematic of FIG. 7 showing the distribution of currents during an undershoot event.

FIG. 8 is the circuit schematic of FIG. 7 showing the distribution of currents during an undershoot event. (For an overshoot event, the following explanations are similar but with the imbalance in the other direction.) During an undershoot event, the base voltage of Q2 is lower than the base voltage of Q1 and all the tail current ($I_{TAIL}$) flows through Q2 to Q4. The collector current of Q1 is zero. In the example of FIG. 8, the tail current is equal to 160 μA, the collector current of Q4 is approximately 150 μA. Ignoring the base currents of Q3 and Q4, 10 μA flows through R1, C1, and the collector of Q3 to ground. Therefore, the collector current in Q3 is equal to the current through resistor R1, or $IC_{Q3}=I_{R1}$. It is the 10 μA current through R1 and Q3 that charges capacitor C1 to its final voltage until the balance is reached at the output of the linear regulator circuit.

Ignoring the voltage drop across R2, which is much smaller compared to $V_{BE\_Q4}$ voltage, the voltage drop across R1 causes the base-to-emitter voltage of Q3 ($V_{BE\_Q3}$) to be 70 millivolts (70 mV) smaller than the base-to-emitter voltage of Q4 ($V_{BE\_Q4}$), which approximately translates into the collector current of Q3 ($IC_{Q3}$) being 1/15th of the collector current of Q4 ($IC_{Q4}$) via the equations that follow.

$$V_{BE\_Q4} - V_{BE\_Q3} = V_{R1},$$

$$V_{BE\_Q4} = (kT/q)\ln(IC_{Q4}/IS),$$

$$V_{BE\_Q3} = (kT/q)\ln(IC_{Q3}/IS),$$

$$(kT/q)\ln(IC_{Q4}/IS) - (kT/q)\ln(IC_{Q3}/IS) = 7\ k\Omega * 10\mu,$$

$$(25.9\ mV)\ln(IC_{Q4}/IC_{Q3}) = 70\ mV,$$

$$IC_{Q4}/IC_{Q3} = \exp(70\ mV/25.9\ mV) \sim 15,$$

where k is the Boltzmann's constant (1.38e-23 J/K), T is the temperature in Kelvin (300° K. for room temperature), IS is the saturation current of a bipolar transistor, and q is the magnitude of the electrical charge in Coulombs (1.6e-19 C).

Although the voltage drop across R1 causes the charging and discharging current of C1 to be an order of magnitude lower than the tail current, and thus causing lower slew rate, R1 is needed for frequency compensation. In series with the AC resistance of the diode connected Q4, the resistance of R1 forms a frequency response pole at the base of Q3 with the Miller capacitance C1 referred back to the base of Q3. If R1 is removed, a much larger capacitor C1 would be needed for the same effect. Also, doubling the tail current of this stage would not double the slew rate. This is shown by the following equations:

$$(kT/q)\ln(IC_{Q4}/IC_{Q3}) = IC_{Q3} * 7\ k\Omega,$$

$$IC_{Q3} + IC_{Q4} = I_{TAIL}.$$

Solving for the above transcendental equations for $I_{TAIL} = 320\ \mu A$:

$$IC_{Q4} = 308\ \mu A,\ \text{and}$$

$$IC_{Q3} = 12\ \mu A.$$

The equations show that doubling the tail current from 160 μA to 320 μA increases the charging/discharging current by only 20% from 10 μA to 12 μA, which is quite inefficient.

Figure 9:
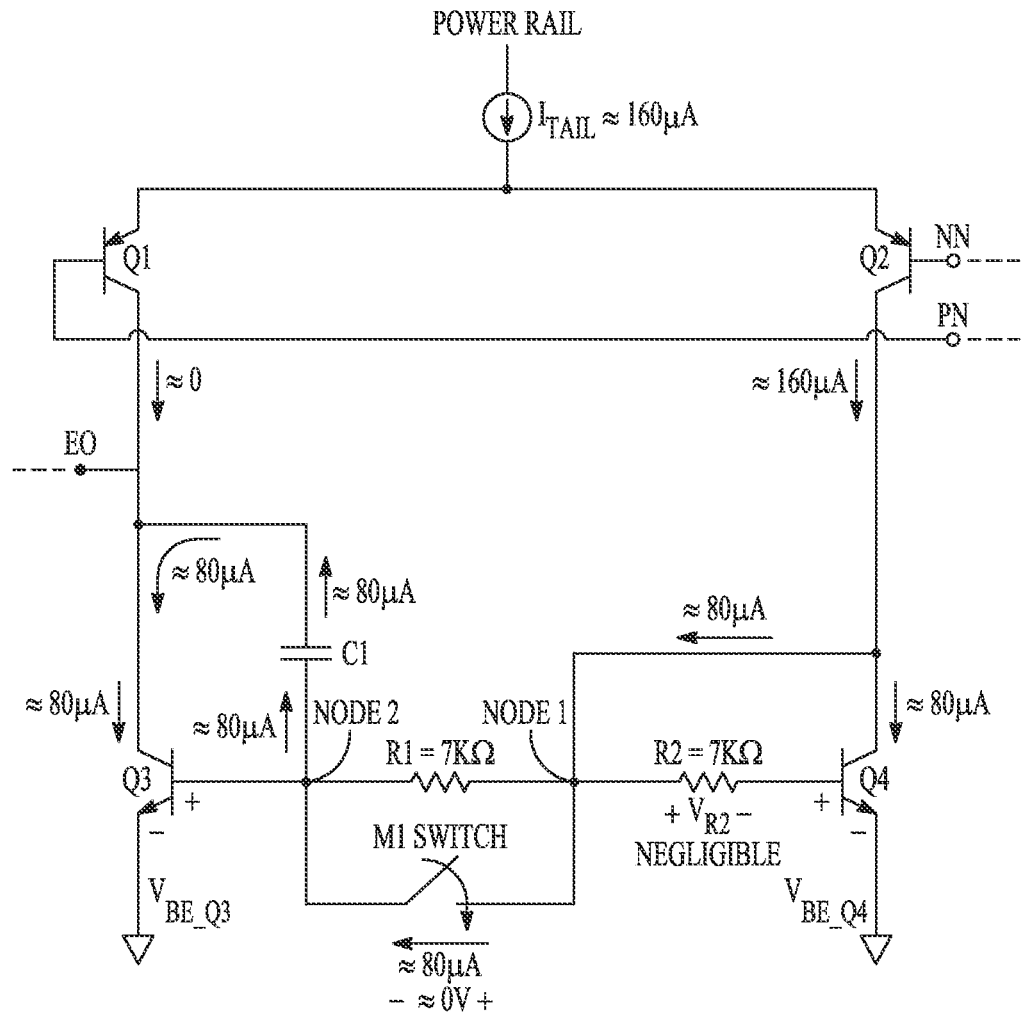
FIG. 9 is a circuit schematic of an example of an amplifier.

FIG. 9 is a circuit schematic of an amplifier similar to the circuit of FIG. 7, but with a switch circuit M1 connected across frequency compensation resistor R1. FIG. 9 also shows the distribution of currents during an undershoot event. By using switch circuit M1 to shunt or short R1 during the undershoot event, then zero voltage drop appears across R1, $V_{BE\_Q4}$ equals $V_{BE\_Q3}$, and hence $IC_{Q4}$ equals $IC_{Q3}$ at 80 μA instead of only 10 μA as in the example of FIG. 8. By this way, the charging and discharging current of C1 increases considerably, (8-fold from 10 μA to 80 μA) without increasing the tail current.

Figure 10:
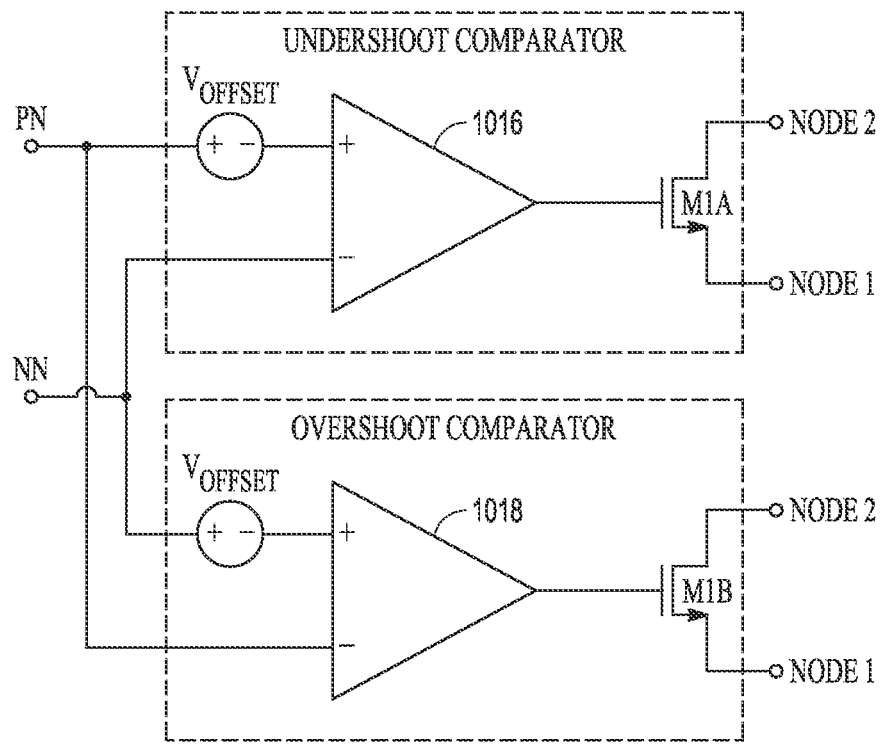
FIG. 10 is a circuit schematic of an example of a circuit to control compensation of the amplifier circuit of the example of FIG. 9.

FIG. 10 is a circuit schematic of an example of a circuit to control the activation of a switch circuit to shunt resistor R1 in FIG. 9 during an undershoot transient event or an overshoot transient event. The circuit includes an undershoot comparator 1016 and an overshoot comparator 1018. The inputs PN and NN are the differential inputs of the amplifier in FIG. 9, which may be the inputs to the final stage amplifier 110 in the error amplifier 102 of the linear regulator circuit 100 of FIG. 2. Each comparator output is connected to the control input of a switch circuit (M1A, M1B) that is connected to the nodes (Node 1, Node 2) across the resistor R1 in FIG. 9. In the example of FIG. 10, the switch circuits are n-type field effect transistors (FETs) and the control input is the gate terminal of the FETs.

The inputs PN and NN are compared to each other using the undershoot comparator 1016 and the overshoot comparator 1018. When an undershoot event is detected using undershoot comparator 1016, switch circuit M1A is activated and resistor R1 is shunted. When an overshoot event is detected using overshoot comparator 1018, switch circuit M1B is activated and resistor R1 is shunted.

An offset voltage ($V_{OFFSET}$) at an input of each of the comparators makes sure that the comparators are off during steady state conditions (e.g., steady state load current at the output of the linear regulator circuit 100 of FIG. 1 or 2). During an undershoot event, the voltage on the PN input increases and the voltage on the NN input decreases. When the PN voltage is greater than the NN voltage by $V_{OFFSET}$, the undershoot comparator 1016 is ON and the overshoot comparator 1018 is OFF. The undershoot comparator 1016 increases the gate voltage of the M1A switch circuit and turns it on fully to short R1 in FIG. 9. However, during the settling phase of the undershoot event, the internal nodes of the error amplifier, including PN and NN, can swing back and forth with respect to each other by more than $V_{OFFSET}$. This can cause the overshoot comparator 1018 to turn on as well, preventing the releasing of the short across R1 and causing chattering and instability at the output of the linear regulator circuit 100 of FIG. 2.

Figure 11:
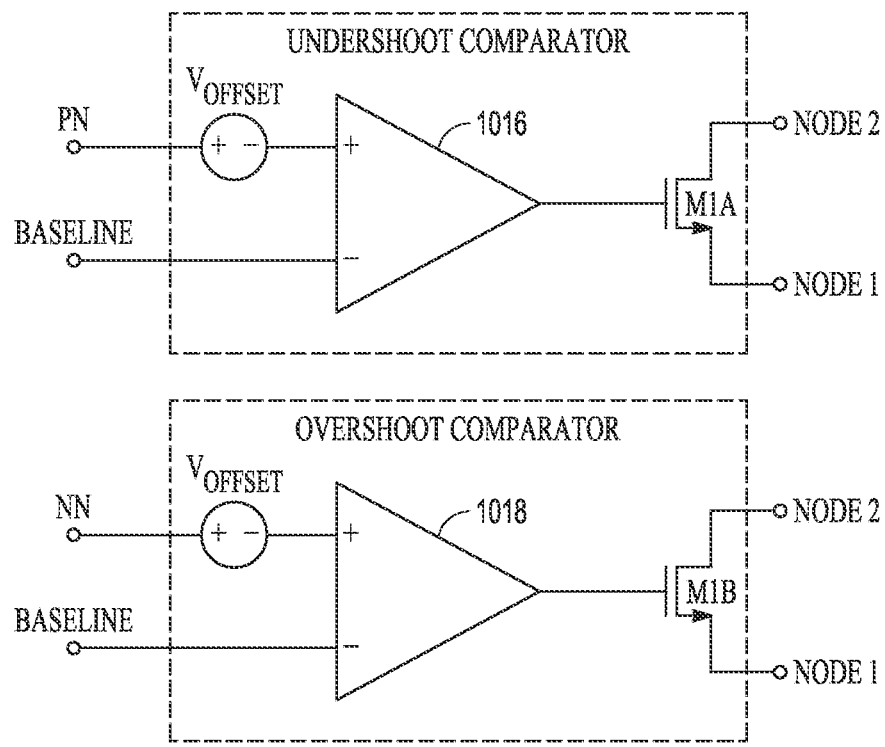
FIG. 11 is a circuit schematic of another example of a circuit to control compensation of the amplifier circuit of the example of FIG. 9.

FIG. 11 is a circuit schematic of another example of a circuit to control the activation of a switch circuit to shunt resistor R1 in FIG. 9 during an undershoot transient event or an overshoot transient event. To eliminate the chattering and instability, the comparing by the undershoot comparator 1016 and overshoot comparator 1018 is changed from the example of FIG. 10. Instead of comparing the differential inputs PN and NN to each other, PN and NN are each compared to a baseline signal (BASELINE), which is equal to the steady state value of the differential inputs and has the same common mode voltage of the differential input nodes.

Figure 12:
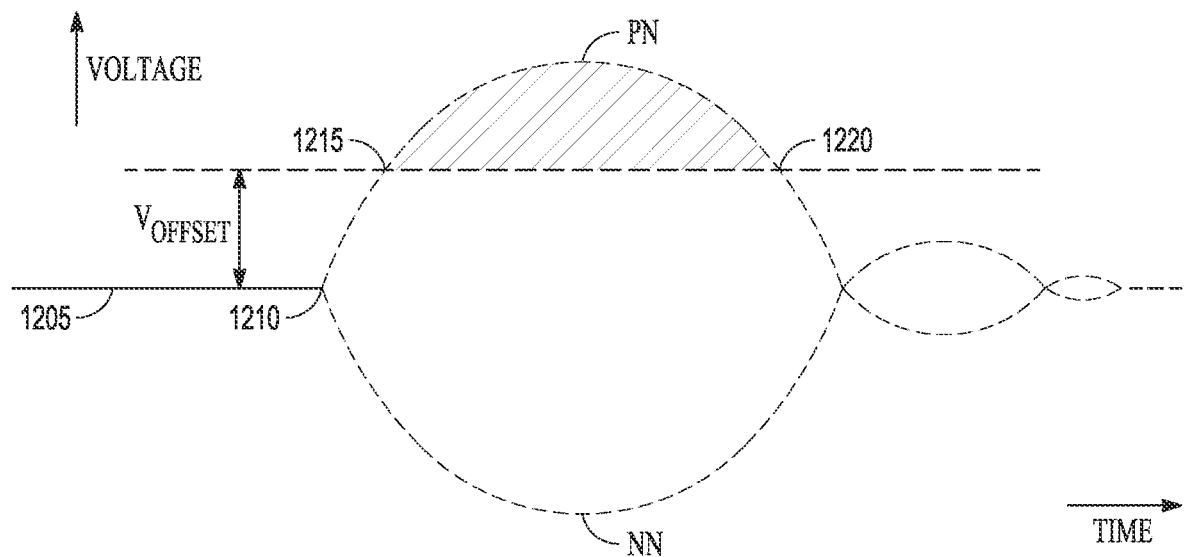
FIG. 12 is a representative waveform of the operation of the circuit of the example of FIG. 11 during an undershoot event.

FIG. 12 is a representative waveform of the operation of the circuit of FIG. 11 during an undershoot event. During steady state 1205, both of the PN and NN inputs are equal to baseline voltage signal $V_{BASELINE}$. At 1210, an undershoot event starts. The voltage on the PN input node begins to increase and the voltage on the NN input node begins to decrease. At 1215, the voltage on the PN input increases above the voltage indicated by the dashed line and the undershoot comparator 1016 turns ON to activate switch circuit M1A and shunt the frequency compensation resistor R1 in FIG. 9. The voltage on the NN input is less than $V_{BASELINE}$ and the overshoot comparator 1018 remains OFF. The amplifier begins to recover from the under shoot and the voltage on the PN input begins to decrease and the voltage on the NN input begins to increase. At 1220, the voltage on the PN input drops below the voltage indicated by the dashed line and the undershoot comparator 1016 turns OFF and deactivates switch circuit M1A to remove the shunt from resistor R1. Some swinging in the voltages of PN and NN occurs before the inputs return to the steady state $V_{BASELINE}$ voltage, but the voltage offset ($V_{OFFSET}$) prevents the comparators from turning on. The comparators have turn ON and turn OFF threshold voltages that differ by a hysteresis voltage, which is not shown in FIG. 12 to simplify the Figure. In some examples, a baseline voltage equal to the common mode plus an offset voltage is used ($V_{BASELINE} = V_{COMMON} + V_{OFFSET2}$).

Figure 13:
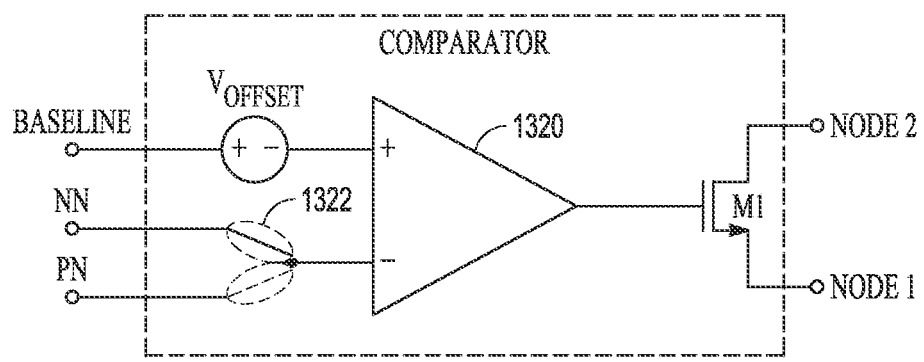
FIG. 13 is a circuit schematic of another example of a circuit to control compensation of the amplifier circuit of the example of FIG. 9.

FIG. 13 is a circuit schematic of another example of a circuit to control the activation of a switch circuit to shunt resistor R1 in FIG. 9 during an undershoot transient event or an overshoot transient event. A single undershoot/overshoot comparator 1320 is used to compare the differential inputs PN and NN to the baseline signal and activate switch circuit M1 to shunt resistor R1 during either an undershoot event or an overshoot event. FIG. 13 shows a switch 1322 connected to the negative input of the comparator to switch in the PN input or the NN input depending on whether an overshoot event or undershoot event is taking place.

Figure 14:
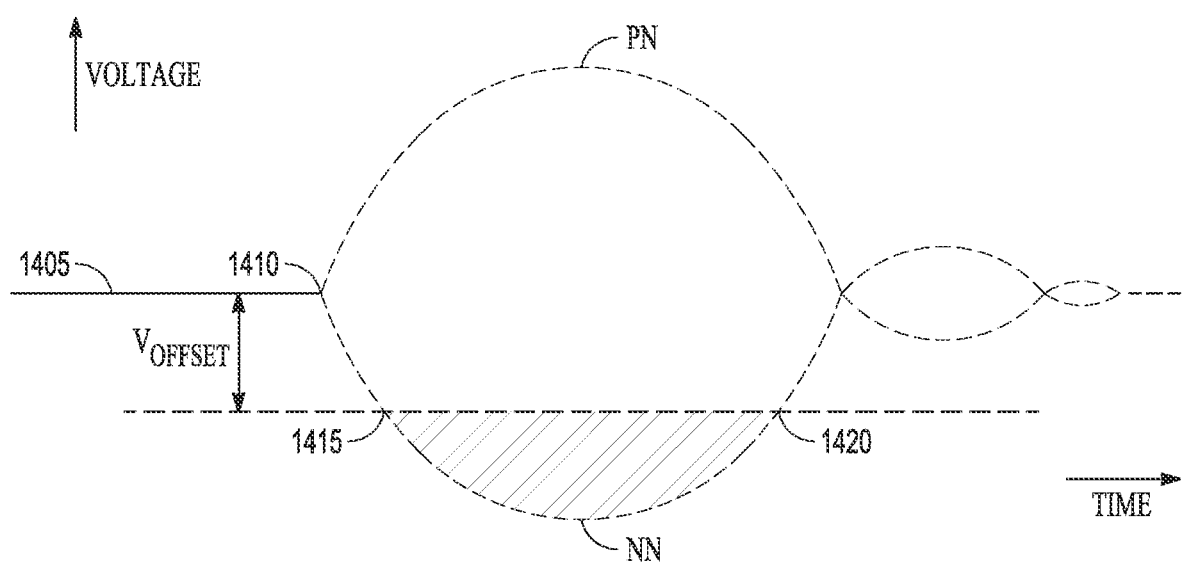
FIG. 14 is a representative waveform of the operation of the circuit of the example of FIG. 13 during an undershoot event.

FIG. 14 is a representative waveform of the operation of the circuit of FIG. 13 during an undershoot event. During steady state 1405, both of the PN and NN inputs are equal to baseline voltage signal $V_{BASELINE}$. At 1410, an undershoot event starts. The voltage on the PN input node begins to increase and the voltage on the NN input node begins to decrease. Conceptually, the switch 1322 in FIG. 13 is connected to the NN input. At 1415, the voltage on the NN input decreases below the voltage indicated by the dashed line and the comparator 1320 turns ON to activate switch circuit M1 and shunt the frequency compensation resistor R1 in FIG. 9. Note that in contrast to the waveform of FIG. 12, the NN input turns the comparator 1320 ON because PN and NN are monitored using the negative rather than the positive input of the comparator used to detect the transient. At 1420, the amplifier recovers from the undershoot event, and the comparator 1320 turns OFF and deactivates switch circuit M1 to remove the shunt from the frequency compensation resistor R1 in FIG. 9. The comparator turn ON and turn OFF thresholds differ by a hysteresis voltage, which is not shown in FIG. 14 to simplify the Figure.

Figure 15:
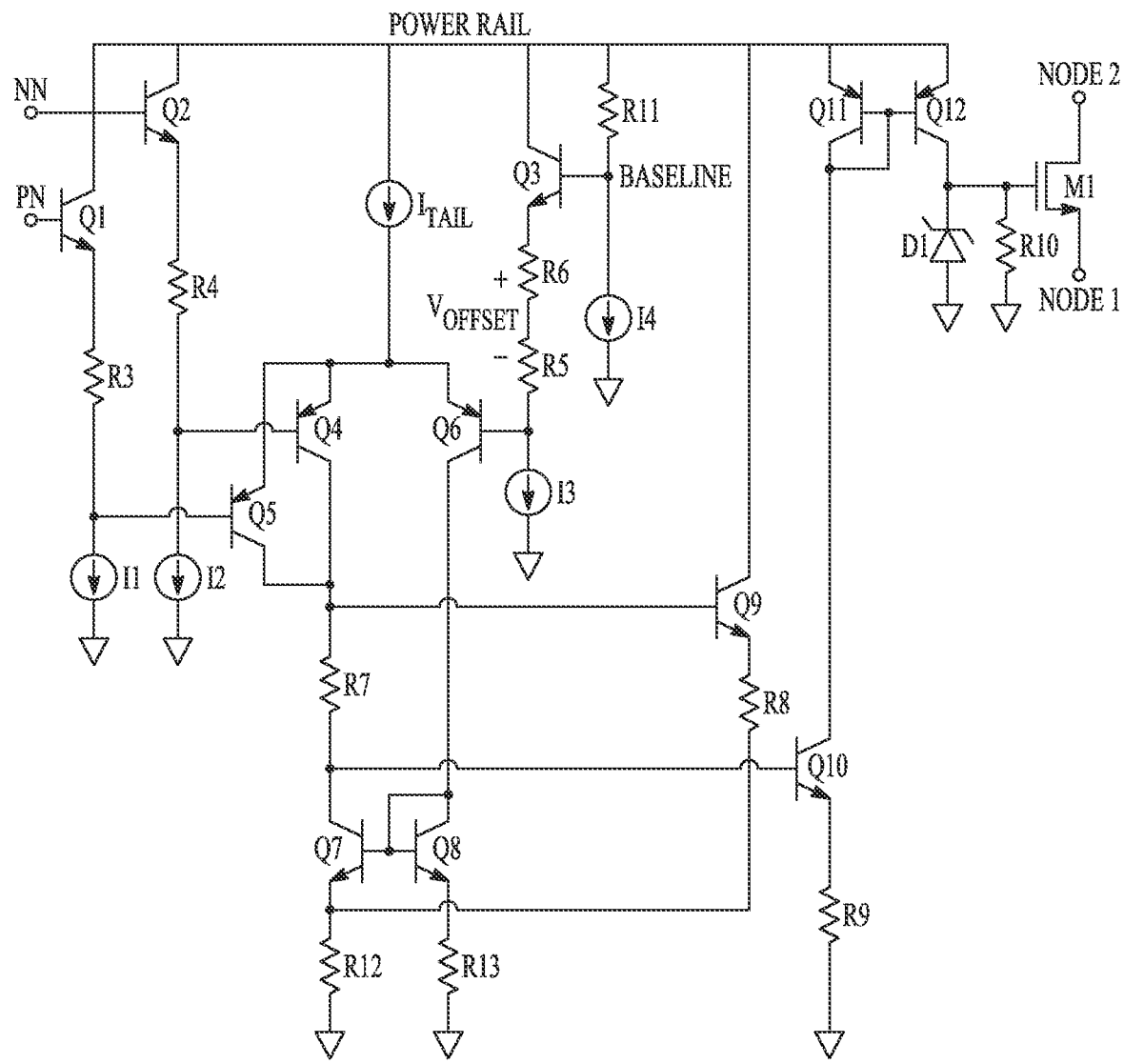
FIG. 15 is a transistor-level circuit schematic of the circuit of the example of FIG. 13.

FIG. 15 is a circuit schematic of a transistor-level implementation of the higher-level circuit schematic of FIG. 13. Under steady state conditions, the voltage at the differential inputs PN and NN is equal to baseline voltage $V_{BASELINE}$. $V_{BASELINE}$ can be set at the BASELINE node at the base of transistor Q3 by adjusting current I4 and the resistance of resistor R11. The identical voltage drops across resistors R3, R4, and R5, generated by current sources I1, I2, and I3, respectively, provide voltage level shifting. Resistor R6 is used to generate an offset voltage. The offset voltage ($V_{OFFSET}$) across R6 makes sure that the base voltage of transistor Q6 is lower than the base voltage of transistor Q4 or the base voltage of transistor Q5, so that all the tail current ($I_{TAIL}$) goes through transistor Q6 to transistor Q8 and forms a base voltage on the base terminal of transistor Q7 to turn Q7 ON. Because Q7 is ON and the currents through Q4 and Q5 are zero, the base voltages of transistors Q9 and Q10 are very close to ground and they are OFF. Therefore, the switch circuit M1 is OFF under steady state conditions.

As shown in the waveform of FIG. 14, the voltage at NN decreases and the voltage at PN increases in an undershoot event. Therefore, the base voltage of Q5 increases and turns Q5 OFF. On the other hand, the base voltage of Q4 decreases and if it becomes less than the base voltage of Q6, then the Q4 current becomes larger than the Q6 current and overcomes the Q7 current, which mirrors Q6 current via the Q8-Q7 current mirror. The Q4 current being higher than the Q7 current results in the increase of base voltages of Q9 and Q10 and they start conducting current. The Q9 current is fed back to the Q7 emitter terminal to introduce hysteresis in the switching of the output of the comparator. The Q10 current is mirrored by the Q11-Q12 current mirror into the R10 resistor to increase the gate voltage of the M1 FET and turn it on fully to short the R1 resistor in FIG. 9. Zener diode D1 provides protection for the gate oxide of the M1 switch by clamping the voltage to a Zener diode voltage.

In an overshoot event, the voltage on the NN input increases and the voltage on the PN input decreases. Therefore, the base voltage of Q4 increases and turns off Q4. On the other hand, the base voltage of Q5 decreases and if it becomes less than the base voltage of Q6, the comparator turns on the M1 switch as for the undershoot event, and the response of the error amplifier to the transient response speeds up for the reasons described previously herein. By judiciously selecting the offset voltage $V_{OFFSET}$, the charging/discharging current of the frequency compensation capacitor C1 in FIG. 9 can be improved and keep the comparator off during steady state for stable operation.

Transistors Q4 and Q5 provide an analog OR of the inputs PN and NN, and provide the function of the switch 1322 in FIG. 13. The transistors monitor the activity at the PN and NN inputs. If a transient causes the base voltage of either of Q4 or Q5 to be less than the base voltage of Q6, the switch is turned on. If the inputs NN and PN are swapped the circuit functions the same.

Figure 16A:
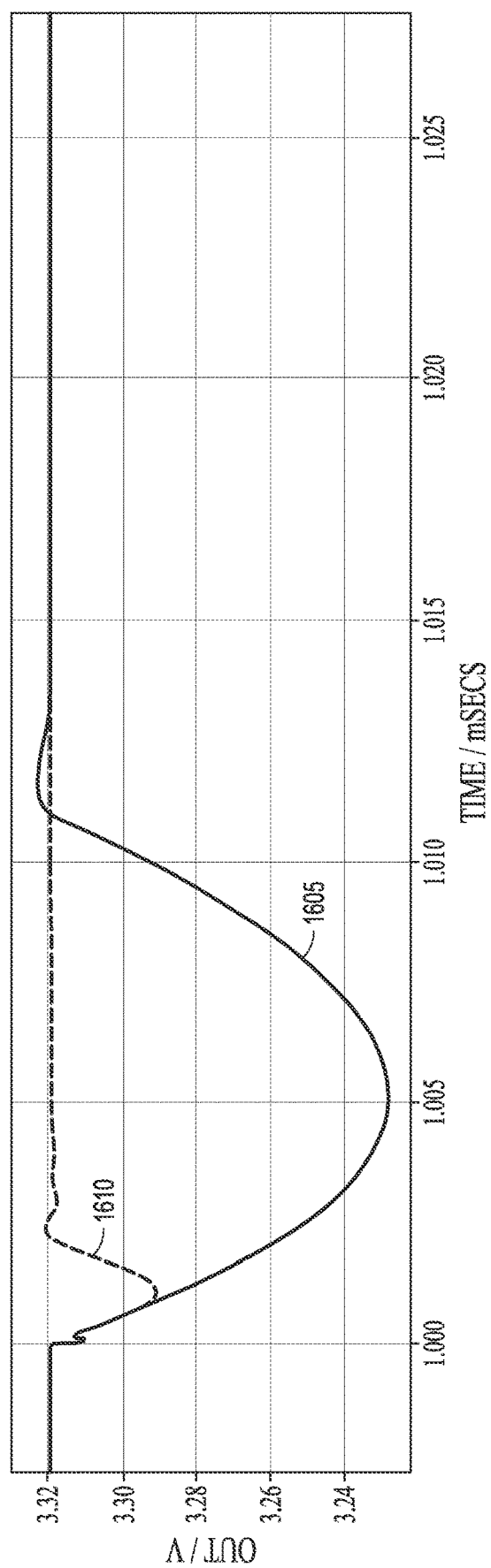
FIGS. 16A and 16B are waveforms of simulation results of a linear regulator circuit.
Figure 16B:
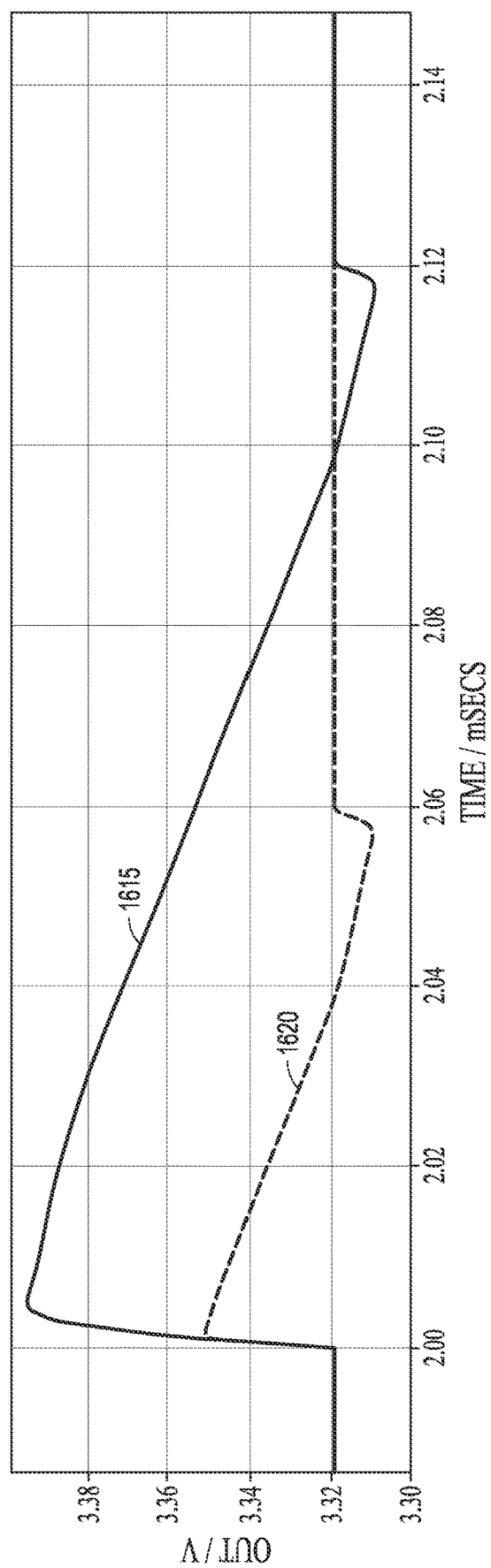

FIGS. 16A and 16B are waveforms of simulation results of a linear regulator circuit with and without the control circuit of FIG. 15 to speed up the transient response. In FIG. 16A, the waveforms simulate undershoot of the linear regulator circuit by a transient in load current from 10 milliamps (10 mA) to one amp (1 A) with a 100 nanosecond (100 nsec) rise time. Waveform 1605 is the waveform without the control circuit. The waveform 1605 exhibits an undershoot of 90 mV. Waveform 1610 is the waveform with the control circuit added and shows the undershoot is reduced to 30 mV. Settling time also improves from approximately 13 μsec to approximately 3 μsec.

In FIG. 16B, the waveforms simulate overshoot of the linear regulator circuit by a transient in load current from 1 A to 10 mA with a 100 nsec fall time. Waveform 1615 is the waveform without the control circuit and exhibits an overshoot of 75 mV. Waveform 1620 is the waveform with the control circuit added and shows the overshoot is reduced to 30 mV. It should be noted that the waveforms with the control circuit do not exhibit chattering in the waveforms. Settling time also improves from approximately 120 μsec to approximately 60 μsec.

Although the explanation in FIG. 15 above is carried out using differential node pairs of PN-NN, any pair of the differential nodes in FIG. 2, P1-N1, P2-N2, . . . , PN-NN, as well as REF-OUT can be used to monitor for the transient event provided the baseline voltage matches the steady state voltage of the differential nodes being monitored. Additionally, the switch M1 is shown to be an n-type FET, but a p-type FET or bipolar transistor can be used by making appropriate changes in the controlling voltages. Further, the control circuits of FIGS. 10, 11, 13, and 15 can be used to improve the transient response of opamps as well as error amplifiers.

Figure 17:
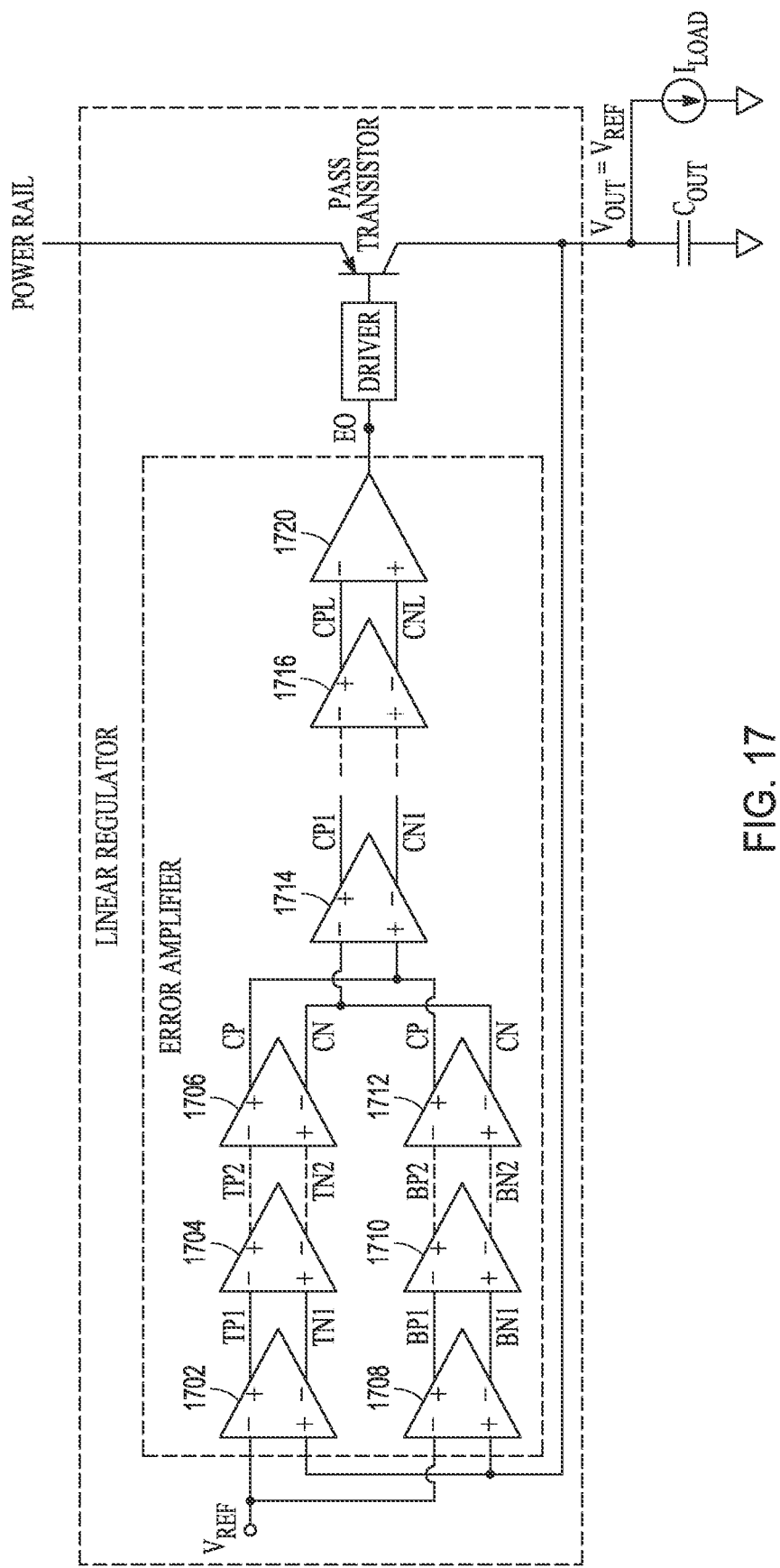
FIG. 17 is a circuit schematic of another example of a linear regulator circuit.

FIG. 17 is a circuit schematic of another example of a linear regulator circuit with the error amplifier implemented as a cascade of N top differential amplifiers 1702, 1704, 1706 (where N is an integer greater than 1), M bottom differential amplifiers 1708, 1710, 1712 (where M is an integer greater than 1), L common differential amplifiers 1714, 1716 (where L is an integer greater than 1), and one differential input to single ended output amplifier 1720. In this generalized implementation of the error amplifier, for $V_{REF}=V_{OUT}$ greater than an intermediate voltage, top differential amplifiers are turned on and bottom differential amplifiers are turned off. Likewise, for $V_{REF}=V_{OUT}$ less than the intermediate voltage, bottom differential amplifiers are turned on and top differential amplifiers are turned off. By selectively activating top or bottom differential amplifiers based on $V_{REF}$ voltage, this error amplifier achieves rail-to-rail input operation from ground to power rail voltage.

Figure 18A:
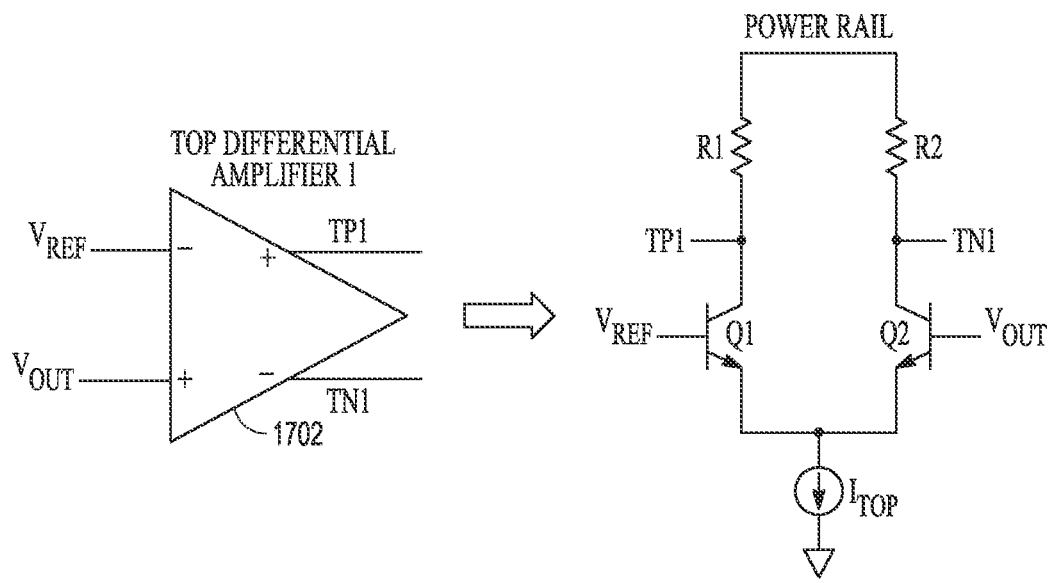
FIGS. 18A and 18B are circuit schematics of the top differential amplifiers and bottom differential amplifiers of the linear regulator of FIG. 17.
Figure 18B:
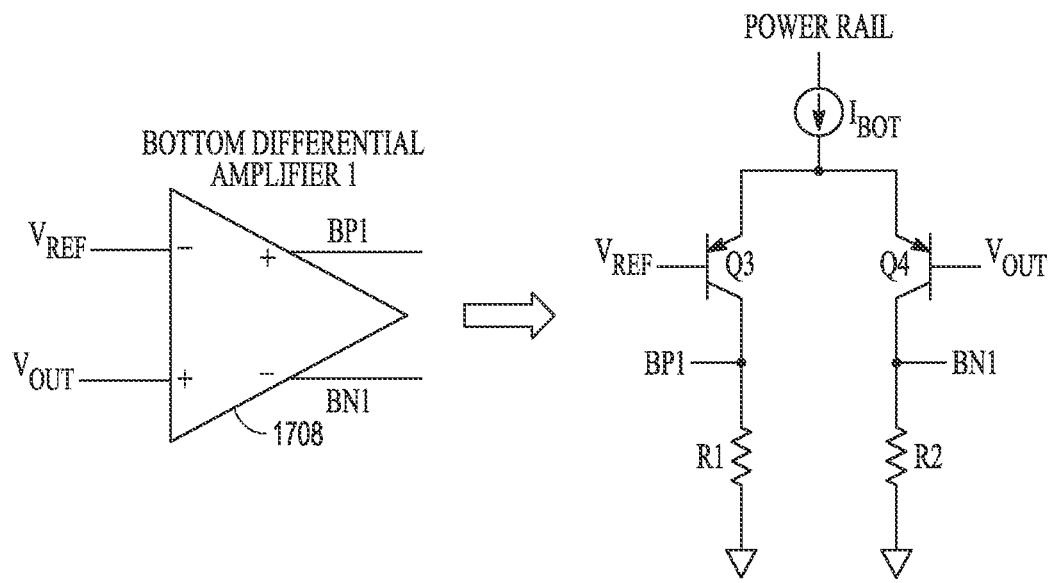

FIGS. 18A and 18B are transistor-level circuit schematics of the top differential amplifier 1 and bottom differential amplifier 1 of FIG. 17, respectively. As an example, if the intermediate voltage is 1V, then, for 1V<VREF<V_power_rail, ITOP current source is activated and IBOT current source is deactivated. Therefore, the top differential amplifier 1 in FIG. 18A formed by differential transistor pair Q1-Q2 and resistor pair R1-R2 acts as the initial stage of the error amplifier of the linear regulator. Likewise, for 0V<VREF<1V, IBOT current source is activated and ITOP current source is deactivated. Therefore, the bottom differential amplifier 1 in FIG. 18B formed by Q3-Q4 and R3-R4 differential pairs act as the initial stage of the error amplifier of the linear regulator.

Figure 19:
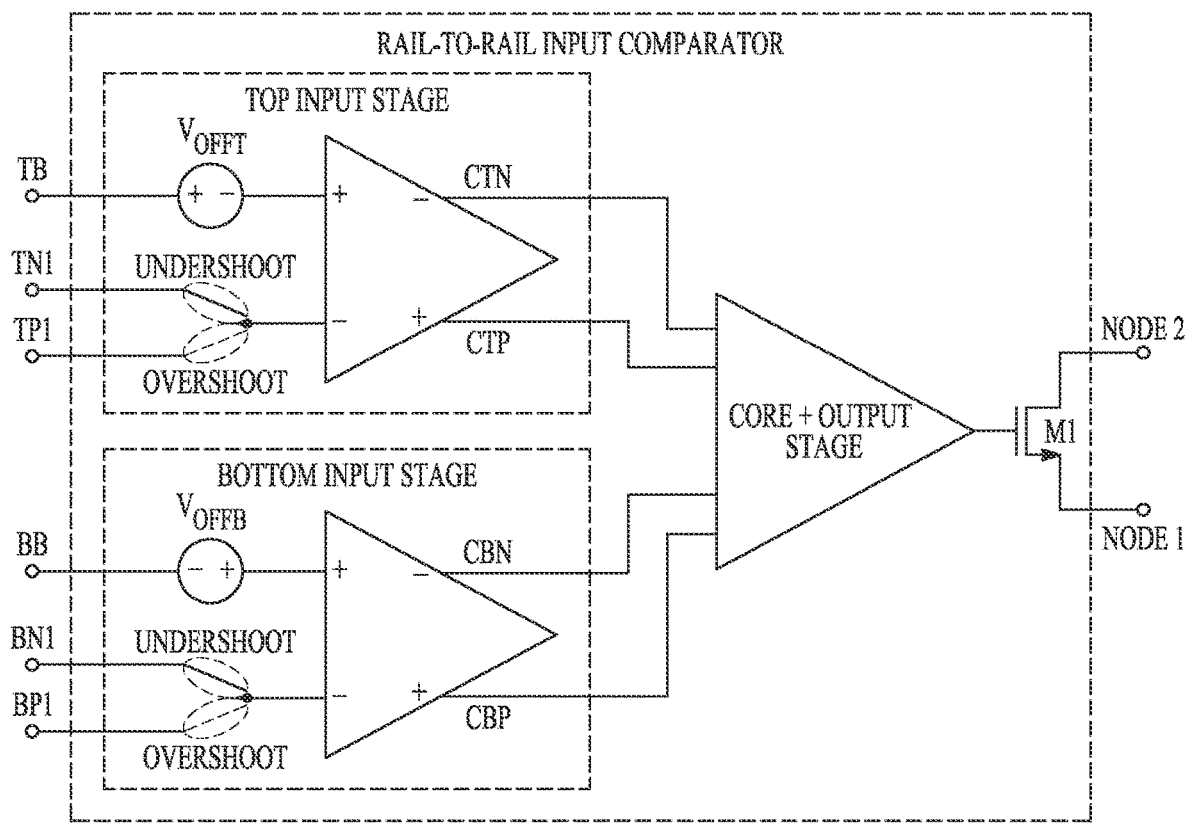
FIG. 19 is a circuit schematic of another example of a circuit to control compensation of an amplifier circuit.

FIG. 19 is a circuit schematic of another example of a circuit to control compensation of the amplifier circuit of the example of FIG. 9. The top input stage is active when top differential amplifiers of FIG. 17 are active, and the bottom input stage is active when bottom differential amplifiers of FIG. 17 are active. Referring to FIG. 17, if CP1-CN1 or CPL-CNL node voltages were used to sense undershoot and overshoot events, then a single input stage comparator as in FIG. 13 would be sufficient to improve undershoot/overshoot magnitude and speedup the linear regulator response regardless of VREF. On the other hand, if initial differential amplifier nodes are to be used to sense undershoot and overshoot events, such as TP1-TN1 and BP1-BN1, then the circuit in FIG. 13 should have two input stages that are activated in tandem with the input stages of the error amplifier in FIG. 17. To that effect, when the top differential amplifiers of the error amplifier in FIG. 17 are active, then the top input stage shown in FIG. 19 is activated, and the bottom input stage in the same figure is inactive. Likewise, when the bottom differential amplifiers of the error amplifier in FIG. 17 are active, then the bottom input stage shown in FIG. 19 is activated, and the top input stage in the same figure is inactive. Each input stage in FIG. 19 has similar input connections as in FIG. 13. The core of the comparator converts the differential outputs of the input stages to a single ended output, which then drives the gate of the M1 switch with the help of the output stage. Conceptually, the core and the output stage of the comparator is lumped into a single symbol.

Figure 20:
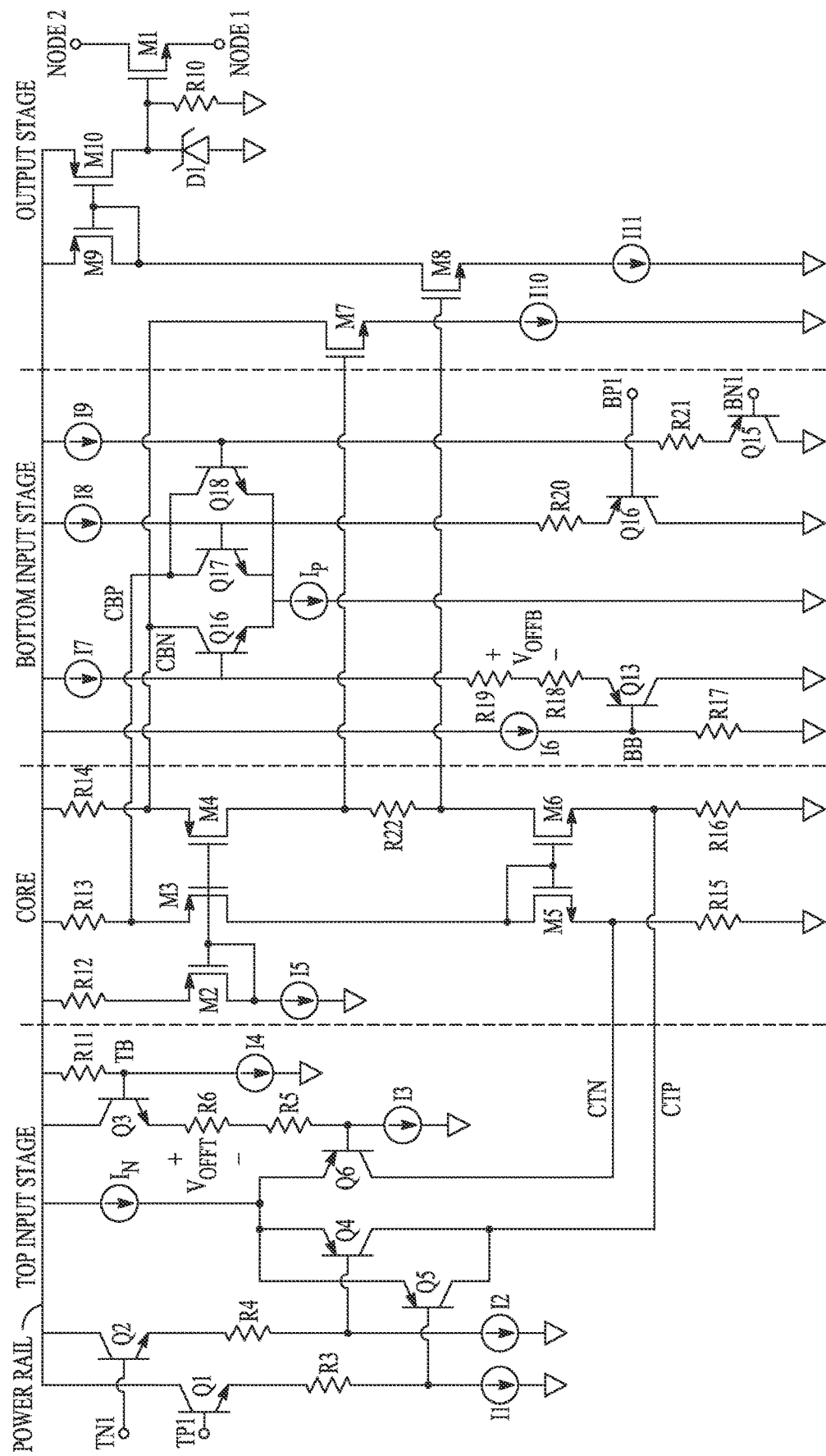
FIG. 20 is a transistor-level circuit schematic of the circuit of the example of FIG. 19.

FIG. 20 is a transistor-level circuit schematic of the circuit of the example of FIG. 19. Inside the top input stage of the schematic, Q1, Q2, Q3, Q4, Q5, Q6, R3, R4, R5, R6, R11, I2, I3, and I4 are identical to the devices with the same labels in FIG. 15. Different from FIG. 15, NN changes to TN1, PN changes to TP1, $I_{TAIL}$ changes to $I_N$, $V_{OFFSET}$ changes to $V_{OFFT}$, baseline changes to TB to accommodate complementary labels for the nodes and devices in the bottom input stage. The complementary device pairs are as follows: Q1-Q14, Q2-Q15, Q3-Q13, Q4-Q18, Q5-Q17, Q6-Q16, R3-R20, R4-R21, R5-R18, R6-R19, R11-R17, I1-I8, I2-I9, I3-I7, and I4-I6 (where I1=I2=I3, I7=I8=I9, R3=R4=R5, and R18=R20=R21). Of the device pairs, the first devices belong to the top input stage, and the second devices belong to the bottom input stage. The core of the comparator is comprised of I5, a current source; M2, M3, M4, p-type metal oxide semiconductor (pmos) current mirrors; R12, R13, R14, resistors from the power rail to the source connections of M2, M3, M4, respectively. M5, M6 form an n-type metal oxide semiconductor (nmos) current mirror with their source connections tied to ground via R15, R16 resistors, respectively. M3 drain is connected to diode connected M5, and M4 drain is connected to M6 drain via R22. In the output stage, M7 gate is connected to M4 drain and M8 gate is connected to M6 drain. When the comparator turns on, M7 and M8 gate voltages increase. M7 directs I10 current to the core of the comparator to generate hysteresis. M8 directs I11 current to M9-M10 pmos current mirror, which then feeds into R10 to raise the gate voltage of M1 switch and shorts the feedback compensation resistor R1 in FIG. 9.

In FIG. 20, for the case of top input stage being turned on under steady state conditions, the voltage at the differential inputs TP1 and TN1 is equal to baseline voltage at TB, or $V_{N1}=V_{TP1}=V_{TB}$. The baseline voltage can be set at the TB node at the base of transistor Q3 by adjusting current I4 and the resistance of resistor R11. The identical voltage drops across R3, R4, and R5, generated respectively by I1, I2, and I3 current sources provide voltage level shifting. Resistor R6 is used to generate an offset voltage. The offset voltage across R6 ($V_{OFFT}$=R6·I3) makes sure that the base voltage of transistor Q6 is lower than the base voltage of transistor Q4 or the base voltage of transistor Q5, so that all the tail current ($I_N$) goes through transistor Q6 to the source node of M5, which is node CTN, and increases the CTN node voltage. In return, the gate voltage of M6 also increases and the drain current of M6 overcomes the drain current of M4 and the gate voltages of M7 and M8 are very close to ground and they are OFF. Therefore, the switch circuit M1 is OFF under steady state conditions for the case of the top input stage being ON.

Similar to the waveform of FIG. 14, the voltage at TN1 decreases and the voltage at TP1 increases in an undershoot event. Therefore, the base voltage of Q5 increases and turns Q5 OFF. On the other hand, the base voltage of Q4 decreases and if it becomes less than the base voltage of Q6, then the Q4 current becomes larger than the Q6 current and in return the voltage of the source node of M6 (CTP voltage) increases and the voltage of the source node of M5 (CTN voltage) decreases. This causes M6 drain current to decrease with respect to M4 drain current resulting in the increase of gate voltages of M7 and M8 and they start conducting current. The M7 current is fed back to the M4 source terminal to introduce hysteresis in the switching of the output of the comparator. The M8 current is mirrored by the M9-M10 current mirror into the R10 resistor to increase the gate voltage of the M1 FET and turn it on fully to short the R1 resistor in FIG. 9. Zener diode D1 provides protection for the gate oxide of the M1 switch by clamping the voltage to a Zener diode voltage.

In an overshoot event, the voltage on the TN1 input increases and the voltage on the TP1 input decreases. Therefore, the base voltage of Q4 increases and turns off Q4. On the other hand, the base voltage of Q5 decreases and if it becomes less than the base voltage of Q6, the comparator turns on the M1 switch as for the undershoot event, and the response of the error amplifier to the transient response speeds up for the reasons described previously herein.

In FIG. 20, for the case of bottom input stage being turned on under steady state conditions, the voltage at the differential inputs BP1 and BN1 is equal to baseline voltage at BB, or $V_{BN1}=V_{BP1}=V_{BB}$. The baseline voltage can be set at the BB node at the base of transistor Q13 by adjusting current I6 and the resistance of resistor R17. The identical voltage drops across R18, R20, and R21, generated respectively by I7, I8, and I9 current sources provide voltage level shifting. Resistor R19 is used to generate an offset voltage. The offset voltage across R19 ($V_{OFFB}$=R19·I7) makes sure that the base voltage of transistor Q16 is higher than the base voltage of transistor Q17 or the base voltage of transistor Q18, so that all the tail current ($I_P$) goes through transistor Q16 to the source node of M4, which is node CBN, and decreases the CBN node voltage with respect to the CBP node voltage. Because the gate voltages of M4 and M3 are constant and set by the gate voltage of M2, the drain current of M4 decreases with respect to the drain current of M3. The larger M3 drain current is mirrored by M5 and M6 nmos current mirror and M6 drain current overcomes M4 drain current and this causes the gate voltages of M7 and M8 to be very close to ground and they are OFF. Therefore, the switch circuit M1 is OFF under steady state conditions for the case of the bottom input stage being ON.

Figure 21:
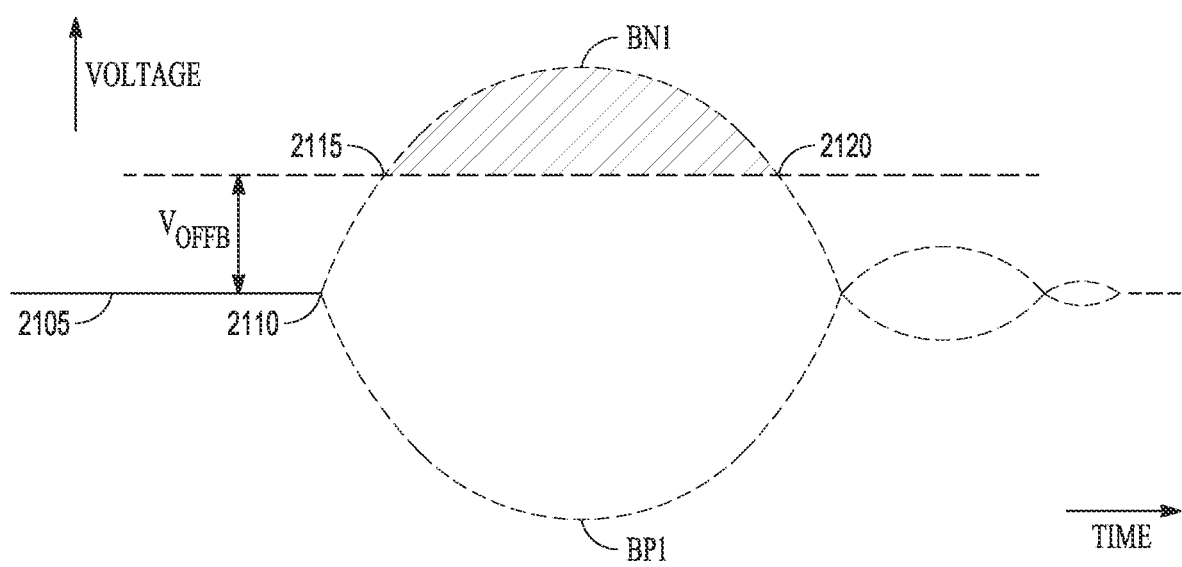
FIG. 21 is a representative waveform of the operation of the circuit of FIG. 20 during an undershoot event.

FIG. 21 is a representative waveform of the operation of the circuit of FIG. 20 during an undershoot event. Similar to the waveform of FIG. 14, the voltage at BN1 increases from steady state 2105 in an undershoot event 2110 and the voltage at BP1 decreases in the undershoot event 2110. (The comparator turn ON threshold 2115 and turn OFF threshold 2120 may differ by a hysteresis voltage, which is not shown in FIG. 21 for convenience). Therefore, the base voltage of Q17 decreases and turns Q17 OFF. On the other hand, the base voltage of Q18 increases and if it becomes more than the base voltage of Q16, then the Q18 current becomes larger than the Q16 current and in return the voltage of the source node of M3 (CBP voltage), decreases and the voltage of the source node of M4 (CBN voltage), increases. This causes M3 drain current to decrease with respect to M4 drain current. The decreased M3 drain current is mirrored by M5 and M6 nmos current mirror. M4 drain current overcomes the M6 drain current resulting in the increase of gate voltages of M7 and M8 and they start conducting current. The M7 current is fed back to the M4 source terminal to introduce hysteresis in the switching of the output of the comparator. The M8 current is mirrored by the M9-M10 current mirror into the R10 resistor to increase the gate voltage of the M1 FET and turn it ON fully to short the R1 resistor in FIG. 9. Zener diode D1 provides protection for the gate oxide of the M1 switch by clamping the voltage to a Zener diode voltage.

In an overshoot event, the voltage on the BN1 input decreases and the voltage on the BP1 input increases. Therefore, the base voltage of Q18 decreases and turns off Q18. On the other hand, the base voltage of Q17 increases and if it becomes more than the base voltage of Q16, the comparator turns on the M1 switch as for the undershoot event, and the response of the error amplifier to the transient response speeds up for the reasons described previously herein.

The devices, systems and methods described herein provide a compensated error amplifier circuit that improves the performance of a regulator circuit without increasing the quiescent current of the regulator circuit. In addition, the regulator circuit still can use advantageously sized output capacitors without sacrificing the output voltage excursions and settling time. Further, the techniques disclosed provide the advantages described without compromising the stability of the LDO.

ADDITIONAL DESCRIPTION AND ASPECTS

A first Aspect (Aspect 1) includes subject matter (such as an electronic circuit) comprising an error amplifier having an output stage including a differential input to single ended output amplifier that includes a frequency compensation resistor; a first switch circuit connected across the frequency compensation resistor, wherein activating the first switch circuit shunts the frequency compensation resistor; and an overshoot and undershoot detection circuit configured to compare differential input nodes of the output amplifier to a baseline voltage signal and activate the first switch circuit when detecting an overshoot condition or an undershoot condition using the baseline voltage signal.

In Aspect 2, the subject matter of Aspect 1 optionally includes the baseline voltage signal being equal to a steady state value of the differential input nodes of the output amplifier and has a common mode voltage of the differential input nodes.

In Aspect 3, the subject matter of one or both of Aspects 1 and 2 optionally includes an overshoot and undershoot detection circuit that includes a comparator circuit. The comparator circuit includes comparator inputs connected to the differential input nodes of the output amplifier of the error amplifier; an OR circuit stage configured to generate a monitoring signal using the differential input nodes; and a comparator output connected to a control input of the first switch circuit; wherein the comparator output activates the first switch circuit in response to an undershoot or overshoot condition of the monitoring signal.

In Aspect 4, the subject matter of Aspect 3 optionally includes a comparator circuit that includes an offset circuit that adds an offset voltage to the baseline voltage signal.

In Aspect 5, the subject matter of one or both of Aspects 1 and 2 optionally includes a second switch circuit connected across the frequency compensation resistor of the error amplifier; and an overshoot and undershoot detection circuit that includes an undershoot comparator circuit including a first differential input connected to a first differential input of the output amplifier of the error amplifier, and an output connected to the first switch circuit, wherein the output activates the first switch circuit in response to detecting the undershoot condition on the first differential input; and an overshoot comparator circuit including a first differential input connected to a second differential input of the output amplifier, and an output connected to the second switch circuit, wherein the output activates the second switch circuit in response to detecting the overshoot condition on the second differential input.

In Aspect 6, the electronic circuit of Aspect 5 optionally includes an overshoot and undershoot detection circuit that adds an undershoot detection offset voltage to the baseline voltage signal and adds an overshoot detection offset voltage to the baseline voltage signal.

In Aspect 7, the subject matter of one or any combination of Aspects 1-6 optionally includes a driver circuit coupled to an output of the error amplifier; a pass transistor that includes a control terminal coupled to an output of the driver circuit, and an output terminal coupled to an output of the electronic circuit; and an error amplifier that includes a differential input stage having one differential input coupled to a voltage reference and the other differential input coupled to the output of the electronic circuit.

In Aspect 8, the subject matter of one or any combination of Aspects 1-7 optionally includes an error amplifier that includes one or more fully differential amplifiers connected in cascade with the output amplifier.

In Aspect 9, the subject matter of one or any combination of Aspects 1 and 3-8 optionally includes the baseline voltage signal being equal to a sum of a common mode voltage of a steady state value of the differential input nodes of the output amplifier and a predetermined offset voltage.

Aspect 10 can include subject matter (such as a method) or can optionally be combined with one or any combination of Aspects 1-9 to include such subject matter, comprising comparing differential input nodes of an output stage of an amplifier to a baseline voltage signal, and shunting a frequency compensation resistor of the output stage when detecting an overshoot condition or an undershoot condition according to the comparing to the baseline voltage signal.

In Aspect 11, the subject matter of Aspect 10 optionally includes generating the baseline voltage signal to be equal to a steady state value of the differential input nodes of the output stage and to have a common mode voltage of the differential input nodes.

In Aspect 12, the subject matter of one or both of Aspects 10 and 11 optionally includes generating a monitoring signal that is an analog OR of the differential input nodes, and detecting the overshoot condition or the undershoot condition by comparing the monitoring signal to the baseline voltage signal.

In Aspect 13, the subject matter of one or any combination of Aspects 10-12 optionally includes detecting the overshoot condition or the undershoot condition by comparing the monitoring signal to the baseline voltage signal and a detection offset voltage.

In Aspect 14, the subject matter of one or any combination of Aspects 10-13 optionally includes comparing a differential input of the output stage to the baseline voltage signal and an undershoot offset voltage to detect the undershoot condition; and comparing the other differential input of the output stage to the baseline voltage signal and an overshoot offset voltage to detect the overshoot condition.

In Aspect 15, the subject matter of one or any combination of Aspects 10-14 optionally includes regulating an output voltage of a linear regulator circuit using negative feedback provided by the amplifier, and detecting an overshoot condition or an undershoot condition of the regulating of the output voltage.

Aspect 16 can include subject matter (such as an electronic circuit) or can optionally be combined with one or any combination of Aspects 1-15 to include such subject matter, comprising an operational amplifier (opamp) and an undershoot and overshoot detection circuit, The opamp includes a differential input and a single ended output, a frequency compensation resistor, and a first switch transistor coupled across the frequency compensation resistor to shunt the frequency compensation resistor when activated.

In Aspect 17, the subject matter of Aspect 16 optionally includes the baseline voltage signal being equal to a steady state value of the differential input nodes of the opamp and has a common mode voltage of the differential input nodes.

In Aspect 18, the subject matter of one or both of Aspects 16 and 17 optionally includes a comparator circuit that includes comparator inputs connected to the differential input nodes of the opamp; an OR circuit stage configured to generate a monitoring signal using the differential input nodes; and a comparator output connected to a control input of the first switch transistor, wherein the comparator output activates the first switch transistor in response to an undershoot or overshoot detection voltage of the monitoring signal.

In Aspect 19, the subject matter of Aspect 18 optionally includes a comparator circuit that includes an offset circuit that adds an offset voltage to the baseline voltage signal.

In Aspect 20, the subject matter of one or both of Aspects 16 and 17 optionally includes a second switch transistor connected across the frequency compensation resistor of the opamp, and an overshoot and undershoot detection circuit that includes an undershoot comparator circuit including a first differential input connected to a first differential input of the opamp, and an output connected to the first switch transistor, wherein the output activates the first switch transistor in response to detecting the undershoot condition on the first differential input; and an overshoot comparator circuit including a first differential input connected to a second differential input of the opamp, and an output connected to the second switch transistor, wherein the output activates the second switch transistor in response to detecting the overshoot condition on the second differential input.

In Aspect 21, the subject matter of Aspect 20 optionally includes an overshoot and undershoot detection circuit that adds an undershoot detection offset voltage to the baseline voltage signal and adds an overshoot detection offset voltage to the baseline voltage signal.

In Aspect 22, the subject matter of one or any combination of Aspects 16 and 18-21 optionally includes the baseline voltage signal being equal to a sum of a common mode voltage of a steady state value of the differential input nodes of the output amplifier and a predetermined offset voltage.

The non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
an error amplifier having an output stage including a differential input to single ended output amplifier that includes a frequency compensation resistor;
a first switch circuit connected across the frequency compensation resistor, wherein activating the first switch circuit shunts the frequency compensation resistor; and
an overshoot and undershoot detection circuit configured to compare differential input nodes of the output amplifier to a baseline voltage signal and activate the first switch circuit when detecting an overshoot condition or an undershoot condition using the baseline voltage signal.

2. The electronic circuit of claim 1, wherein the baseline voltage signal is equal to a steady state value of the differential input nodes of the output amplifier and has a common mode voltage of the differential input nodes.

3. The electronic circuit of claim 1, wherein the overshoot and undershoot detection circuit includes a comparator circuit including:
comparator inputs connected to the differential input nodes of the output amplifier of the error amplifier;
an OR circuit stage configured to generate a monitoring signal using the differential input nodes; and
a comparator output connected to a control input of the first switch circuit;
wherein the comparator output activates the first switch circuit in response to an undershoot or overshoot condition of the monitoring signal.

4. The electronic circuit of claim 3, wherein the comparator circuit includes an offset circuit that adds an offset voltage to the baseline voltage signal.

5. The electronic circuit of claim 1, including:
a second switch circuit connected across the frequency compensation resistor of the error amplifier;
wherein the overshoot and undershoot detection circuit includes:
an undershoot comparator circuit including a first differential input connected to a first differential input of the output amplifier of the error amplifier, and an output connected to the first switch circuit, wherein the output activates the first switch circuit in response to detecting the undershoot condition on the first differential input; and
an overshoot comparator circuit including a first differential input connected to a second differential input of the output amplifier, and an output connected to the second switch circuit, wherein the output activates the second switch circuit in response to detecting the overshoot condition on the second differential input.

6. The electronic circuit of claim 5, wherein the overshoot and undershoot detection circuit adds an undershoot detection offset voltage to the baseline voltage signal and adds an overshoot detection offset voltage to the baseline voltage signal.

7. The electronic circuit of claim 1, including:
a driver circuit coupled to an output of the error amplifier;
a pass transistor including a control terminal coupled to an output of the driver circuit, and an output terminal coupled to an output of the electronic circuit; and
wherein the error amplifier includes a differential input stage having one differential input coupled to a voltage reference and the other differential input coupled to the output of the electronic circuit.

8. The electronic circuit of claim 1, wherein the error amplifier includes one or more fully differential amplifiers connected in cascade with the output amplifier.

9. The electronic circuit of claim 1, wherein the baseline voltage signal is equal to a sum of a common mode voltage of a steady state value of the differential input nodes of the output amplifier and a predetermined offset voltage.

10. A method of overshoot and undershoot compensation for an amplifier;
the method comprising:
comparing differential input nodes of an output stage of the amplifier to a baseline voltage signal; and
shunting a frequency compensation resistor of the output stage when detecting an overshoot condition or an undershoot condition according to the comparing to the baseline voltage signal.

11. The method of claim 10, including generating the baseline voltage signal to be equal to a steady state value of the differential input nodes of the output stage and to have a common mode voltage of the differential input nodes.

12. The method of claim 10, including:
generating a monitoring signal that is an analog OR of the differential input nodes; and
detecting the overshoot condition or the undershoot condition by comparing the monitoring signal to the baseline voltage signal.

13. The method of claim 12, including detecting the overshoot condition or the undershoot condition by comparing the monitoring signal to the baseline voltage signal and a detection offset voltage.

14. The method of claim 10, including:
comparing a differential input of the output stage to the baseline voltage signal and an undershoot offset voltage to detect the undershoot condition; and
comparing the other differential input of the output stage to the baseline voltage signal and an overshoot offset voltage to detect the overshoot condition.

15. The method of claim 10, including:
regulating an output voltage of a linear regulator circuit using negative feedback provided by the amplifier; and
wherein the detecting an overshoot condition or an undershoot condition includes detecting an overshoot condition or an undershoot condition of the regulating of the output voltage.

16. An electronic circuit comprising:
an operational amplifier (opamp) including:
a differential input and a single ended output;
a frequency compensation resistor; and
a first switch transistor coupled across the frequency compensation resistor to shunt the frequency compensation resistor when activated; and
an undershoot and overshoot detection circuit configured to compare differential input nodes of the opamp to a baseline voltage signal and activate the first transistor circuit when detecting an overshoot condition or an undershoot condition using the baseline voltage signal.

17. The electronic circuit of claim 16, wherein the baseline voltage signal is equal to a steady state value of the differential input nodes of the opamp and has a common mode voltage of the differential input nodes.

18. The electronic circuit of claim 16, wherein the overshoot and undershoot detection circuit includes a comparator circuit including:
comparator inputs connected to the differential input nodes of the opamp;

an OR circuit stage configured to generate a monitoring signal using the differential input nodes; and a comparator output connected to a control input of the first switch transistor, wherein the comparator output activates the first switch transistor in response to an undershoot or overshoot detection voltage of the monitoring signal.

19. The electronic circuit of claim 18, wherein the comparator circuit includes an offset circuit that adds an offset voltage to the baseline voltage signal.

20. The electronic circuit of claim 16, including:

a second switch transistor connected across the frequency compensation resistor of the opamp;

wherein the overshoot and undershoot detection circuit includes:

an undershoot comparator circuit including a first differential input connected to a first differential input of the opamp, and an output connected to the first switch transistor, wherein the output activates the first switch transistor in response to detecting the undershoot condition on the first differential input; and an overshoot comparator circuit including a first differential input connected to a second differential input of the opamp, and an output connected to the second switch transistor, wherein the output activates the second switch transistor in response to detecting the overshoot condition on the second differential input.

21. The electronic circuit of claim 20, wherein the overshoot and undershoot detection circuit adds an undershoot detection offset voltage to the baseline voltage signal and adds an overshoot detection offset voltage to the baseline voltage signal.

22. The electronic circuit of claim 16, wherein the baseline voltage signal is equal to a sum of a common mode voltage of a steady state value of the differential input nodes of the output amplifier and a predetermined offset voltage.

* * * * *